United States Patent [19]
Neugebauer et al.

[11] Patent Number: 5,696,459
[45] Date of Patent: Dec. 9, 1997

[54] HIGH VOLTAGE ELECTRONIC AMPLIFIERS

[75] Inventors: Charles F. Neugebauer, Mountain View, Calif.; Jon Brunetti, Astoria, N.Y.; Gunter Steinbach, Palo Alto, Calif.

[73] Assignee: Arithmos, Inc., Santa Clara, Calif.

[21] Appl. No.: 448,554

[22] PCT Filed: Jan. 24, 1995

[86] PCT No.: PCT/US95/00933

§ 371 Date: Oct. 23, 1995

§ 102(e) Date: Oct. 23, 1995

[87] PCT Pub. No.: WO95/20266

PCT Pub. Date: Jul. 27, 1995

(Under 37 CFR 1.47)

[51] Int. Cl.[6] .................................. H03K 17/14
[52] U.S. Cl. .................... 327/108; 327/379; 323/315
[58] Field of Search .................... 327/65, 108–112, 327/387, 310, 379, 545, 546, 333, 327, 561–563; 345/90, 98; 323/315, 316; 330/253, 257, 288, 277

[56] References Cited

U.S. PATENT DOCUMENTS

| | | | |
|---|---|---|---|
| 4,251,743 | 2/1981 | Hareyama | 307/297 |
| 4,645,945 | 2/1987 | de Sartre | 307/254 |
| 4,668,919 | 5/1987 | De Weck | 330/253 |
| 4,677,323 | 6/1987 | Marsh | 307/571 |
| 4,682,059 | 7/1987 | Garcia | 330/257 |
| 4,896,061 | 1/1990 | Ahmed | 307/575 |
| 5,055,719 | 10/1991 | Hughes | 307/491 |
| 5,363,059 | 11/1994 | Thiel | 330/257 |
| 5,500,615 | 3/1996 | Barter | 327/112 |

OTHER PUBLICATIONS

Parpia, Z., "Modeling and Characterization of CMOS-Compatible High-Voltage Device Structures," IEEE Transactions on Electron Devices, 34(11):2335–2343 (1987).

Horowitz and Hill, The Art of Electronics, 2d ed., Cambridge Univ. Press (1989), pp. 72–76, 102–104, 140–171.

Kenney, J.G., et al., "An Enhanced Slew Rate Source Follower," IEEE Journal of Solid-State Circuits, 30(2):144–146 (1995).

Phillip E. Allen et al., CMOS Analog Circuit Design, Saunders College Publishing, Harcourt Brace Jovanovich College Publishers, pp. 304–307 (1987).

Phillip E. Allen et al., CMOS Analog Circuit Design, Holt, Rinehart and Winston, pp. 299–308 (1987).

*Primary Examiner*—Timothy P. Callahan
*Assistant Examiner*—Eunja Shin
*Attorney, Agent, or Firm*—Lyon & Lyon LLP

[57] ABSTRACT

Novel high voltage electronic amplifiers that are capable of being monolithically integrated using low voltage semiconductor fabrication processes are described and claimed. A cascade of low voltage current mirrors is described that can act as a high voltage amplifier output circuit. A transconductor and level shift circuit is also described that can be employed in the high voltage amplifier output circuit. A high voltage current source is described and is constructed from the series combination of a low voltage transistor and a parasitic field oxide transistor. Additionally, a differential amplifier having bias-current shunting transistors is described that can be used to limit quiescent current from the output power supply of the high voltage amplifiers.

19 Claims, 19 Drawing Sheets

HIGH VOLTAGE ELECTRONIC AMPLIFIERS

TECHNICAL FIELD

The present invention relates to electronic amplifiers having a high-voltage output stage capable of a large output swing, a large transconductance and low quiescent power consumption.

BACKGROUND OF THE INVENTION

Many electronic systems utilize high voltage signals that exceed the 5 volts or less logic signal levels of typical digital systems. For example, applications such as communications systems that incorporate modems, serial line drivers, etc., may be required to operate at elevated voltage levels. In many flat panel displays, row and column electrodes are driven by integrated circuits ('ICs') that must be capable of driving high voltages. Many types of nonvolatile semiconductor memories, e.g. EPROMs, EEPROMs and flash EEPROMs, require on-chip manipulation of high voltage signals in order to control programming. Implantable electronic medical devices, such as pacemakers, often require signal or output voltages in the range of 5 to 40 volts.

Typically, conventional monolithic high voltage amplifier circuits are fabricated in special CMOS processes that permit high voltage operation, since transistors fabricated in conventional low voltage CMOS processes normally break down at voltages around 6 to 10 volts. Transistor breakdown is due to phenomena such as zener breakdown of the drain, short channel effects and gate oxide failure. J. Y. Chen, *CMOS Devices and Technology for VLSI*, Prentice Hall, Englewood Cliffs, N.J., 1990; S. M. Sze, *Semiconductor Devices Physics and Technology*, John Wiley & Sons, New York, 1985. Double diffused drain structures, thicker oxides and long channel field effect transistors ("FETs") have been used in high voltage processes to achieve higher voltage breakdown levels. But these modifications result in characteristically larger transistors, i.e. a minimum transistor length greater than about 1.5 microns (µm) as compared to less than 0.5 µm for low voltage transistors. Larger transistors limit the integration density of the desired circuit functions.

Integrated circuits are generally fabricated with standard (also known in the art as "commodity") CMOS processes that are less expensive than specialty high voltage CMOS processes, but are only capable of reliably supporting voltages at or below 5 volts. Combining large, high voltage transistors with small, low voltage transistors on the same semiconductor substrate can be relatively expensive as a result of additional mask steps in the IC fabrication process. Therefore, specialty fabrication of conventional high voltage circuits raises the cost of manufacturing for applications that require extended voltage ranges.

Integrated circuits that implement high voltage circuitry using a low voltage fabrication process have been reported, but with limited applicability. In these circuits, high voltage n-FETs and p-FETs are fabricated by extending the drain terminal of the FETs with lightly doped parasitic implants. See Z. Parpia, C. A. T. Salama and R. A. Hadaway, 'Modeling and Characterization of CMOS-Compatible High-Voltage Device Structures,' *IEEE Transactions on Electron Devices*, Vol. ED-34, No. 11, 1987, pp. 2335–2343; M. J. Declercq, M. Schubert and F. Clement, '5V-to-75V CMOS Output Interface Circuits,' *Proceedings of the International Solid State Circuits Conference*, San Francisco, 1993, pp. 162–163. These high voltage FETs have lightly doped drain-to-substrate diodes, which diodes for standard CMOS fabrication processes typically can sustain voltages of over 40 volts. These high voltage n-FETs and p-FETs can be used in operational amplifiers and buffer circuits with conventional transistor arrangements.

One of the problems the devices described by Parpia et al. and Declercq et al. have is that the gate oxide between the low voltage gate and the high voltage drain is a thin oxide, which cannot reliably withstand voltages above 5 volts for most small geometry CMOS processes. Fabricating high voltage devices using small device geometries (i.e. submicron transistor length) can degrade the transistor significantly and impact long term reliability, if the transistors must sustain voltages above 5 volts. This degradation is due to the phenomena of electron tunneling, avalanche breakdown and charge retention in oxide traps. For this reason, previously described high voltage circuits have been restricted to relatively large geometry (i.e. greater than 1.5 µm minimum transistor length) low voltage CMOS processes, a restriction that hinders the integration density and hence applicability of the circuits.

Additionally, the previously described devices have a large gate-to-drain capacitance caused by the overlap of the drain and gate regions. Since the lightly doped parasitic implants are not self-aligned with the gate, as is the case with conventionally fabricated transistors, the overlap and hence capacitance of these transistors can be significantly larger than that of self-aligned transistors. These large capacitances can significantly limit the speed of the transistors.

For applications in which power consumption is a concern, such as battery-powered devices, amplifiers that minimize power-supply currents and have low power-supply voltage operation are desirable. Examples of conventional micropower operational amplifier designs are described in P. E. Allen and D. R. Holberg, *CMOS Analog Circuit Design*, Holt, Rinehart and Winston, New York, 1987, pp. 497–504. Traditionally, such micropower amplifier designs were unable to provide large output currents while still maintaining micropower consumption when quiescent. A dynamically or adaptively-biased operational amplifier has been described that attempts to overcome this problem by boosting the tail current when a differential input is applied. Degrauwe, et al, 'Adaptive Biasing CMOS Amplifiers,' *IEEE Journal of Solid-State Circuits*, Vol. SC-17, No. 3, June 1982, pp. 522. Unfortunately, the solution presented by Degrauwe et al suffers from instability problems and requires well-matched components.

OBJECTS OF THE INVENTION

It is therefore one object of the present invention to provide high voltage amplifiers and output circuits that can be fabricated in commonly available IC fabrication processes that typically support only low voltages, thereby permitting cost-effective monolithic integration of high voltage and low voltage circuitry.

A second object is to provide high voltage electronic amplifiers that have improved integration density, performance and power consumption.

A third object is to provide amplifiers that reduce power consumption by limiting quiescent power consumption and do not have instability problems or require well-matched components.

Other objects of the present invention will become apparent from the following disclosure.

SUMMARY OF THE INVENTION

As the trend in the semiconductor industry is toward higher levels of integration in smaller products, it is essential to combine as many circuits on a single silicon chip as possible. The inability of transistors fabricated using conventional low voltage CMOS processes to support voltages higher than 5 volts necessitates fabricating high voltage and low voltage circuits on separate ICs. Thus, additional silicon chips are required in most systems, thereby lowering reliability, raising cost and increasing system size. A high voltage output circuit compatible with sub-micron device geometries and oxides that avoids large gate-to-drain capacitances is therefore needed. Such an output circuit would enable the integration of output circuit functionality on state-of-the-art digital/analog ICs without diminishing reliability or integration density.

The present invention provides high voltage amplifiers and output circuits which can be fabricated in commonly available digital IC fabrication processes that typically support only low voltages. Additional amplifiers are described that are constructed in CMOS fabrication processes that provide a thicker gate oxide and have improved performance characteristics. Also, amplifiers are described that can limit or reduce quiescent power consumption through the use of either bias-current shunting transistors or a pull-up/pull-down transconductor configuration, or both together.

In one aspect of the present invention, voltage limiting devices present in typical IC fabrication processes are used to construct high voltage circuitry. Thus, either parasitic zener diodes or intrinsic drain-to-well zener diodes are used to limit the voltage across individual transistors. The voltages dropped across a cascade of thin gate oxide transistors can be added to form an output voltage. This output voltage can be greater than the standard tolerance of transistors in any particular CMOS fabrication process. The output voltage of ICs constructed according to the present invention is limited only by the well-to-bulk breakdown voltage of the CMOS process used to fabricate the IC. Current well-to-bulk breakdown voltages are approximately 40 volts.

In a second aspect, the present invention relates to an electrical apparatus, preferably in an integrated circuit form, that is controlled by low voltage signals in order to drive a high voltage output. The apparatus can be fabricated using low voltage CMOS processes and is configured such that the gate oxide transistors are subjected to a voltage within the standard tolerances of the low voltage process, resulting in output voltages in excess of the standard tolerances of the low voltage process.

In a third aspect, the present invention provides a high voltage driver circuit having a cascade of low voltage current mirrors that drive the output. The voltage across each current mirror stage is limited to a fraction of the total voltage drop. These current mirror stages can be biased by a high voltage current source.

In a fourth aspect, the present invention provides a current source capable of sustaining high voltages. This high voltage current source is comprised of a high voltage parasitic field oxide or cascode transistor that permits high voltage operation and a thin gate oxide transistor that allows the high voltage current source to be controlled by low voltage signals. Multiple high voltage current sources can be combined with the cascade of low voltage current mirrors to create a high voltage driver circuit.

In a fifth aspect, the present invention provides a high voltage driver circuit that employs a pull-up transconductor and a pull-down transconductor which, in conjunction with level shift circuits, a high voltage power supply and cascode transistors, act to drive the output. In this example, each cascode transistor drops a fraction of the total voltage. The transconductor arrangement provides a compact design for substantially increasing the gain of the amplifier and may also serve to limit quiescent current flow.

In a sixth aspect, the present invention includes high voltage amplifiers that are constructed with transistors having a gate oxide that is thicker than is provided with typical CMOS fabrication processes. These "thicker" gate oxide FETs have improved speed and threshold voltage accuracy, because the gate oxide used for these high voltage devices can be much thinner and better controlled than the field oxide gates of the field oxide transistors described herein.

In a seventh aspect, the present invention includes a differential amplifier that has bias-current shunting transistors. If this configuration is used to provide low voltage control signals directly to the high voltage output stage, quiescent current consumption from the high voltage power supply can be substantially reduced. The bias-current shunting transistors may be combined with the pull-up/pull-down transconductor arrangement in certain applications to reduce both pre-amplification and output stage power consumption.

One advantage of high voltage output circuits of the present invention is that inexpensive implementations of high voltage driver circuits that can be monolithically integrated on the same substrate as low voltage CMOS circuitry are provided. The high voltage circuitry can be used in applications in which high voltage outputs are needed, such as flat panel display drivers, telecommunication ICs, EPROM/EEPROM memory devices and power control circuits. Circuits described in the present application can be used to implement DC-to-DC converter circuitry, voltage regulation and high-low driver circuits. The output voltages of these circuits will be capable of exceeding the standard voltage restrictions of the semiconductor fabrication technology.

A second advantage of the present invention is that high voltage circuits can be constructed with the low voltage components and thin gate oxides (less than 200 angstroms) that are not required to sustain voltages above 5 volts. Previous attempts at designing high voltage amplifiers using low voltage processes required relatively thick gate oxides (greater than 400 angstroms) to prevent electron tunneling, avalanche breakdown and other detrimental effects. By using the cascadable output stage of the present invention, the designer is permitted great flexibility in choosing output voltage ranges (from 5 volts to greater than 40 volts) and performance characteristics. The present invention is applicable to much smaller feature size fabrication processes than previous attempts at implementing high voltage amplifiers.

A third advantage of the present invention is that low voltage CMOS processes currently permit the design of circuits that have smaller transistor sizes, higher speeds and lower power requirements than conventional high voltage processes. Thus, since many of the circuits described herein can be fabricated in standard CMOS processes, the present invention improves integration density, performance and power consumption for circuit functions that are constructed according to the teachings herein. Also, digital microprocessor and signal processing circuitry can be fabricated at a much higher density in commodity low voltage CMOS processes than with specialty high voltage CMOS processes, allowing the integration of sophisticated digital and analog signal processing circuits onto the same integrated circuit.

A fourth advantage of the present invention is that less expensive low voltage CMOS processes can be employed when integrating the present high voltage output circuits. Currently, typical high voltage ICs are fabricated using specialized high voltage CMOS processes that are more expensive per chip to fabricate than the commodity digital CMOS process utilized by the present invention. The present invention can eliminate the need to fabricate high voltage circuits using special high voltage semiconductor fabrication processes.

A fifth advantage of the present invention is that output stage signals from the present amplifiers can be generated by a differential amplifier that acts to limit the quiescent current draw from the high voltage power source. This feature is particularly advantageous in portable applications in which power consumption is a concern.

Other advantages and aspects of the present invention will become apparent upon review of the detailed description of the working embodiments, the figures and the claims.

BRIEF DESCRIPTION OF THE FIGURES

FIG. 6 is a detailed schematic of a second high voltage output circuit. The high voltage output circuit has a series of cascaded p-FET current mirrors that provide a pull-up function as in FIG. 3. The pull-down portion of the output circuit is formed from a high voltage n-FET (27) in a cascode configuration.

DETAILED DESCRIPTION OF THE WORKING EMBODIMENTS

The high voltage output circuits of the present invention are capable of driving large capacitive loads (typically 10 to over 100 picofarads) with fast rise/fall times (typically less than 1 microsecond). Also, amplifiers constructed according to the present teachings may employ either bias-current shunting transistors or a pull-up/pull-down transconductance arrangement to reduce quiescent current draw.

In one aspect, the amplifiers of the present invention use parasitic devices present in conventional low voltage CMOS fabrication processes to attain high output voltages without exceeding the voltage specifications of standard CMOS transistors. The output stage of the present invention can attain an output voltage range several times greater than the maximum specified voltage for the standard transistors of the fabrication process with which the amplifier is constructed. Standard CMOS fabrication processes are not typically used to implement amplifiers capable of driving large (>100 picofarads) external loads at the high voltages (>10 volts) needed for many applications, such as flat panel LCD drivers, telecommunication ICs, medical devices and nonvolatile semiconductor memories. Typical CMOS FETs break down at voltages less than 10 volts due to the zener action of the FET drain, punch-through in short channel FET devices and oxide insulator failure due to hot electron injection, tunneling, breakdown and trapping effects. These effects are described in Chen and in Sze.

Figure 1:
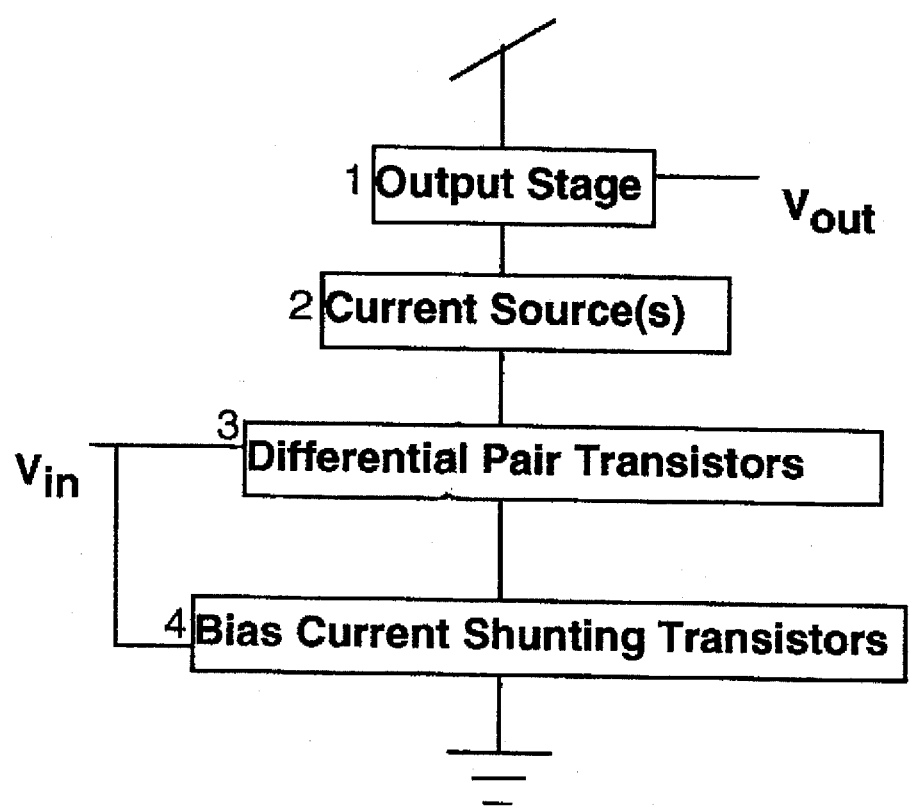
FIG. 1 is a block diagram of the high voltage amplifiers described in the present application.

The various aspects of the present invention are shown in FIG. 1 as a block diagram of a high voltage amplifier. The amplifier shown in FIG. 1 has a differential transistor pair (3) to generate voltage signals in response to input signals ($V_{in}$) and the voltage signals generated by the differential pair are then applied to a current source(s) (2). The current source(s) (2) in turn source and/or sink current from the output stage (1) and, through the use of current mirrors within the output stage (1), an output signal ($V_{out}$) is generated. Constructing the output stage (1) according to the teachings of the present invention permits large output voltage ranges of 15 volts or more. Also, bias-current shunting transistors (4) may be added to the amplifier to limit quiescent current draw from either the pre-amplification stage or the output power supply, depending upon the configuration used.

I. High Voltage Current Source and Output Stage

The working embodiments of the present invention are preferably implemented as a monolithic integrated circuit (IC) using complementary metal oxide semiconductor (CMOS) fabrication technology. The figures and descriptions will use the symbols and terms customary of such CMOS embodiments.

Figure 2:
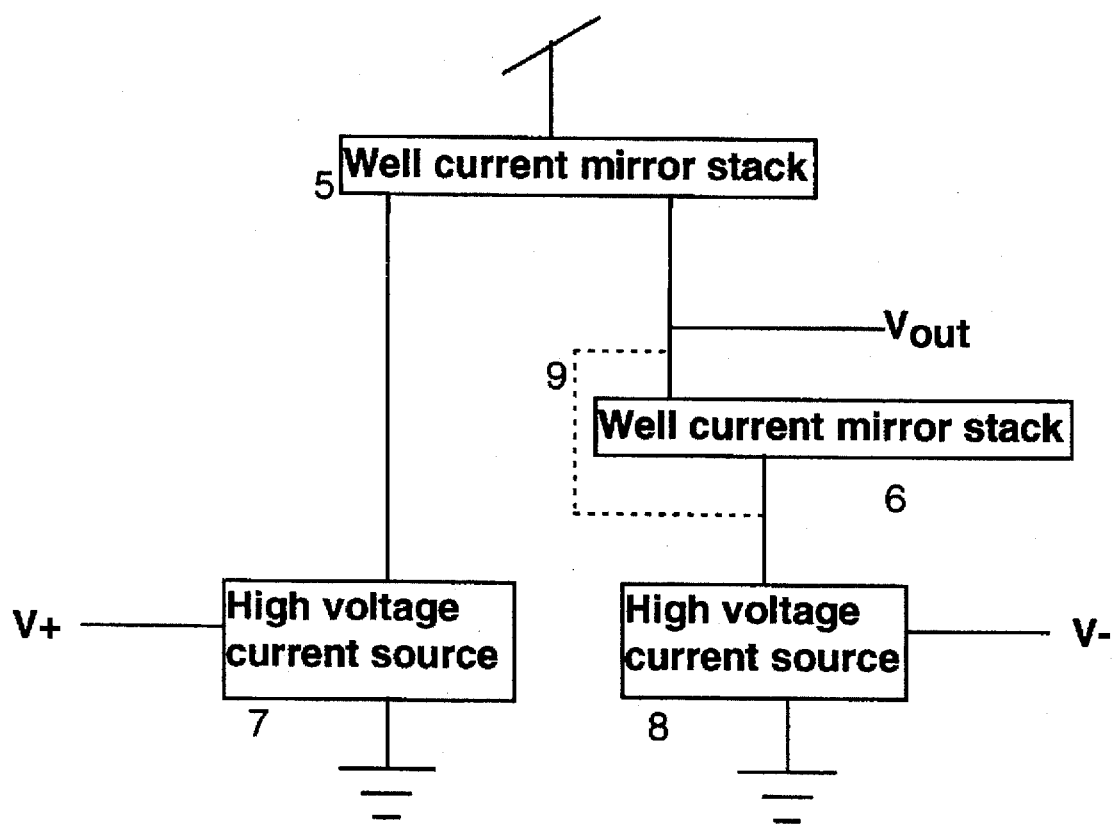
FIG. 2 is a block diagram of a high voltage output stage that employs a stack (or cascade) of well current mirrors (5, 6) and current sources capable of sustaining high voltages (7, 8).

A block diagram of an output stage and current source appropriate for a high voltage output circuit incorporating the present invention is shown in FIG. 2. This circuit is comprised of two well current mirror stacks (5, 6) and two high voltage current sources (7, 8). The well current mirror stacks used in the present invention consist of at least two current mirror stages within each stack, wherein the two current mirror stages have been cascaded. As is noted by the dotted line (9), the pull-down well current mirror stack (6) is not essential to practice the present invention. The high voltage current sources (7, 8) may be driven by a differential voltage input (V+, V−).

Figure 3:
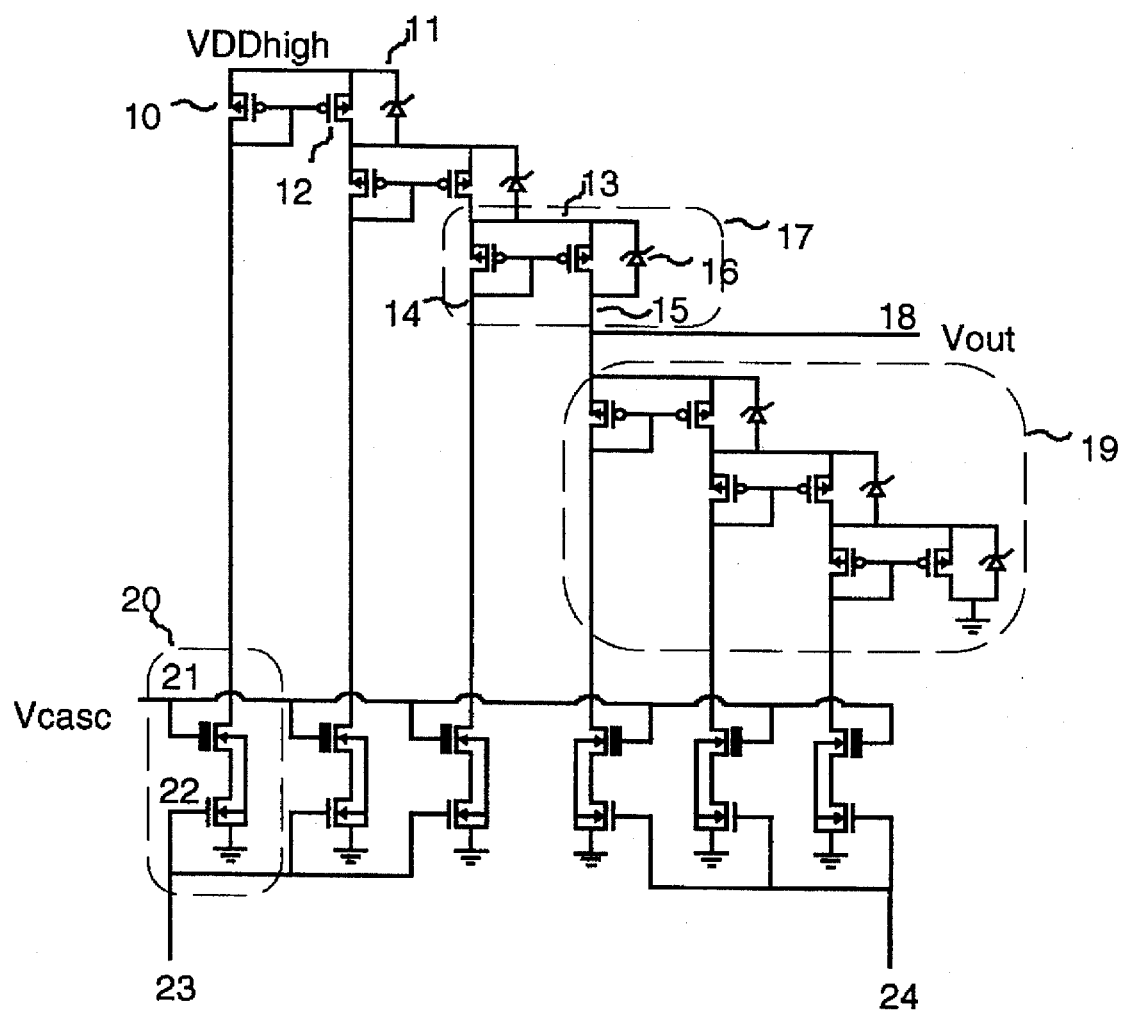
FIG. 3 is a detailed schematic of a high voltage output circuit that has been constructed according to the block diagram of FIG. 2. The high voltage output circuit uses a cascade of current mirrors (11–17, 19) that have separate wells to achieve a wide output voltage range.

The present invention may be further understood by a discussion of a working embodiment of the circuit of FIG. 2, which embodiment is shown in FIG. 3. One repeated element of this circuit is the high voltage current source circuit (20). The high voltage current source is formed by two n-channel FETs (21, 22), one (22) of which is a conventional gate device that is constructed using a thin oxide between the gate and substrate. The second transistor (21) is a parasitic field oxide transistor. As those skilled in the art will understand, a distinction is made herein between thin gate oxide FETs and field oxide FETs, both of which are found in typical CMOS processes. In this circuit, the thin oxide transistor is acting as a transconductor and the field-oxide transistor is acting as a level shift.

Figure 4:
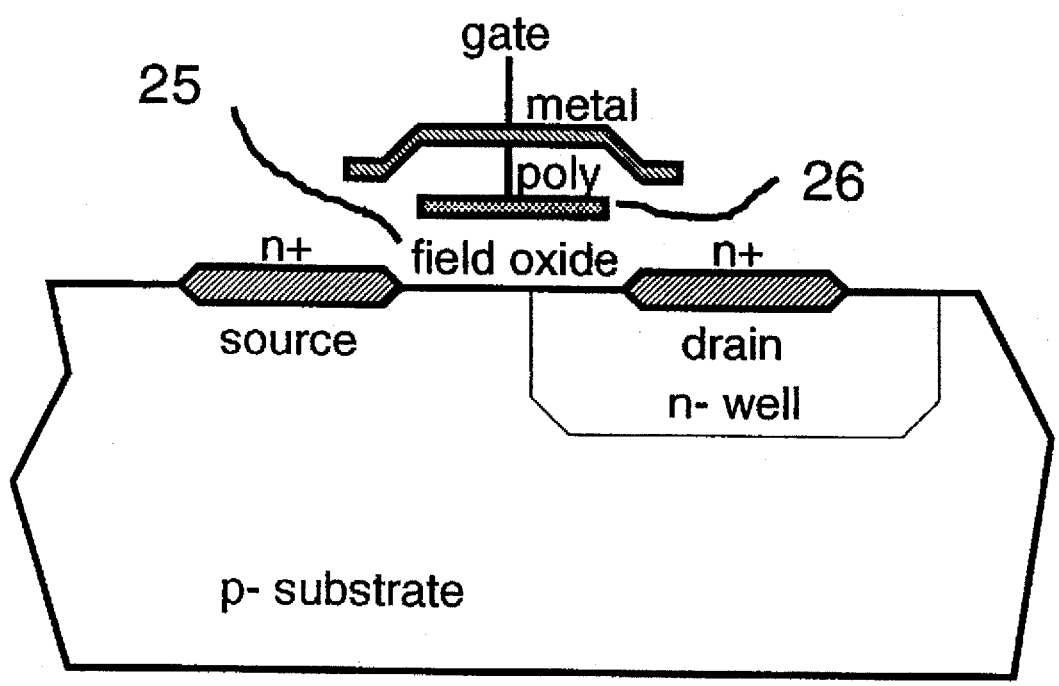
FIG. 4 is a physical cross-section of a parasitic field oxide FET that can be used in the high voltage output stages of the present invention and also in the high voltage switch of FIG. 19.

A cross-section of the field oxide transistor (21) is shown in FIG. 4. The device shown in FIG. 4 is compatible with most CMOS fabrication processes currently available. Referring to FIG. 4, the source terminal is a heavily doped implant that is typically used as the source or drain terminal of a standard thin gate oxide FET. The gate terminal of the field oxide FET of FIG. 4 is formed by two stacked electrodes that are electrically connected together. The lower gate electrode (26) is a polysilicon construction and is typically used as the gate terminal of conventional thin gate oxide FETs. But, in contrast to conventional thin gate oxide FETs, the gate electrode and channel region or substrate of the field oxide FETs used in the present invention are separated by a thick field oxide (25).

In a typical CMOS fabrication process, thin gate oxide covers the standard thin oxide transistor channels and the thicker field oxide is found everywhere else on the IC. The term 'field oxide' is defined herein as any oxide or insulator that is thicker than the thin gate oxide of the particular fabrication process. Since the polysilicon gate cannot overlap the source and drain diffusions, an upper electrode, typically constructed of aluminum or polysilicon, overlaps the lower gate electrode and overlaps the source and drain implant areas. By raising the voltage of the gate terminal, the field oxide channel region between the source and drain terminals can be inverted to conduct current from the source to the drain.

The drain region of the field oxide FETs used in the examples described herein have a heavily doped region resembling the source terminal, except that a well implant has been added that completely surrounds the drain implant. Parasitic well-to-bulk diodes in typical CMOS fabrication processes can sustain a reverse bias of over 40 volts. The drain of the field oxide FET is limited in voltage by the parasitic well-to-bulk diode breakdown voltage, which is typically about 40 volts. As used herein, the term 'high voltage' is defined as a voltage that is greater than conventional transistor voltage limits for the given semiconductor fabrication process, but is less than the parasitic well-to-bulk diode breakdown voltage.

Referring to FIG. 4, the field oxide (25) acts as the gate oxide of the field oxide transistor. The polysilicon electrode beneath the middle portion of the field oxide FET (26) reduces the transistor threshold since the thickness of the field oxide beneath polysilicon is usually less than that found under metal electrodes.

Although the transistor of FIG. 4 has a high threshold voltage (i.e. greater than 5 volts), due primarily to the thick oxide, it is being used in the present invention as a cascode transistor. Examples of cascode transistors are described in P. E. Allen and D. R. Holberg, *CMOS Analog Circuit Design*, Holt, Rinehart and Winston, New York, 1987, p. 233. Therefore, the high threshold voltage of the field oxide transistor (21) shown in FIG. 3 is not a hindrance for many applications of the present circuits. The gate voltage applied to all field oxide FETs in the present invention can be a constant high voltage, $V_{casc}$, which voltage is above the threshold of the field oxide FET, typically 10 to 20 volts. As a cascode transistor, the parasitic field oxide FET only passes the control current of the first n-FET (22).

The field oxide FET (21) should be designed such that the saturation current of FET (21) is larger than the maximum current that can be conducted through control FET (22), based upon the field oxide FET gate voltage, $V_{casc}$, that the designer has chosen to apply to the gate of FET (21). Thus, the current passed by FETs (21) and (22) is limited by the thin gate oxide FET (22) and hence controlled by the low level voltage applied to the gate of FET (22). The advantage of this pull-down design over those described by Parpia et al. and Declercq et al. is that no thin gate oxides are subjected to high voltage drops and no large control gate-to-drain capacitances are necessary.

The term 'field oxide FET' as used herein is defined as any parasitic FET structure that is constructed with a gate oxide thicker than the thin gate oxide of the typical fabrication process FETs. The exact layout of the source, drain and gate electrodes depends upon the application chosen by the designer, as does the choice of electrode layers to be used as the gate terminal. Multi-layer metal and polysilicon processes are available in which any combination of metal or polysilicon layers can be used as the gate. Additional implants compatible with conventional CMOS fabrication processes also may be used to modify thresholds, control channel width, etc., depending upon the application. Additionally, transistor breakdown by the punch-through effect can be avoided by increasing the length of the field oxide FET channel, typically to a few microns. J. Y. Chen, *CMOS Devices and Technology for VLSI*, Prentice Hall, Englewood Cliffs, N.J., 1990. Those skilled in the art will recognize that numerous material and layout modifications to the embodiments described herein are possible that will not affect functionality.

An alternative high-voltage field effect transistor structure with improved electrical performance can be constructed if the designer is willing to slightly modify the thin-gate oxide transistors available in most commodity CMOS manufacturing processes by selectively increasing the gate oxide thickness on those transistors that are expected to experience large gate to channel voltages. This process modification requires one additional mask step in the fabrication sequence and thus can be expected to increase the manufacturing cost of the process. In return, the transistors thus modified have improved speed, lower threshold voltage, e.g. 1 volt instead of 10 volts, and better transconductance. These performance improvements result because the thicker gate oxide, while thick enough to sustain high-voltage operation, can be only 1/10th as thick as the typical field oxide found in the field oxide FETs described above.

The substrate, source/drain implants and highly-doped drain of this "thick" gate oxide transistor are identical to the field oxide transistor described above and depicted in FIG. 4. The lightly doped well implant surrounding the drain region also serves to reduce the risk of hot-electron damage to the transistor by reducing the peak electric field strength at the drain end of the transistor channel. Without this beneficial side effect, operation of the FET with simultaneously applied large drain currents and large drain-to-source voltage could lead to hot-electron induced gate damage. Hot-electron induced gate damage has been described, for example, in Y. Leblebici and S. M. Kang, *Hot-carrier reliability of MOS VLSI circuits*, Kluwer Academic Publishers, Boston 1993. Because of the importance of the Lightly Doped Drain region for the reliability of the device, in the following discussion we shall refer to this high-voltage gate transistor by its customarily abbreviated discussion name, a LDD transistor.

Therefore, those skilled in the art will recognize that in all following discussion, the choice of whether to use field-oxide transistors, LDD transistors or possibly some other high voltage device is left to the designer.

The term 'well FET', as used herein, is defined as a FET that has a well implant for its bulk terminal (i.e. a p-channel transistor in a n-well fabrication process is a well FET). The term 'native FET' is used to describe a FET that has the substrate for its bulk terminal (i.e. a n-channel transistor in a n-well fabrication process). The terms 'well' and 'native' can be added to the name of a circuit structure, e.g. 'well current mirror' or 'native differential pair', to indicate the type of transistor used in the circuit structure. This terminology is chosen since the present invention can be fabricated in either n-well or p-well CMOS fabrication processes.

FIG. 3 shows a high voltage output section fabricated using a n-well process. Thus, in this embodiment of the present invention the p-FETs are 'well FETs' and the n-FETs are 'native FETs.' Referring to FIG. 3, the output pull-up section of the high voltage output circuit comprises a cascade (i.e. a series connected chain) of p-channel (i.e. 'well') current mirrors (17). A current mirror is a standard analog circuit element that creates an output current in proportion to an input current. Examples of a number of different types of current mirrors that may be used with the present invention can be found in Allen and Holberg.

Each current mirror in FIG. 3 has an upper rail terminal (13), an input current terminal (14) and an output current terminal (15). The upper rail terminal of the top or first current mirror in the cascade is connected to one terminal of a two terminal high voltage power supply, $V_{DDhigh}$ (11), which power supply is typically 5 to 40 volts. The voltage $V_{DDhigh}$ herein is arbitrarily referenced to electrical ground. Those skilled in the art will recognize that $V_{DDhigh}$ can be referenced to any voltage that is less positive than $V_{DDhigh}$. Each current mirror exists in its own well implant that can withstand a high voltage to ground (i.e. up to the well-to-bulk diode breakdown voltage, which is typically above 40 volts). Each FET of the current mirror has a source, drain, gate and bulk terminal. The bulk terminals of the FETs in one current mirror are typically also the common well for that current mirror.

The input current FET (10) of the current mirror is usually smaller in size than the output current FET (12). The output current FET (12) must provide significant current to the output electrode (18) while the input current FET (10) is used only to provide the gate voltage of the output current FET (12). Those skilled in the art will perceive numerous modifications that can be made to this circuit, including tailoring the transistor sizing of the current mirrors to obtain application specific performance objectives. These size modifications are considered to be within the scope of the present invention.

Referring still to FIG. 3, the output current terminal of the top current mirror of the pull-up cascade is connected to the upper rail of the immediately following current mirror in the cascade. Those skilled in the art may modify the cascade by inserting additional series components that can add functionality or tailor operation of the present circuits to a given application. These modifications are also considered to be within the scope of the present invention. Additional current mirrors are connected in a similar fashion to create the upper cascade, i.e., the output current terminal of one current mirror is connected to the upper rail terminal of the immediately following current mirror. The last current mirror of the upper cascade has its output current terminal connected to the output electrode, $V_{out}$ (18), of the output circuit.

Figure 5:
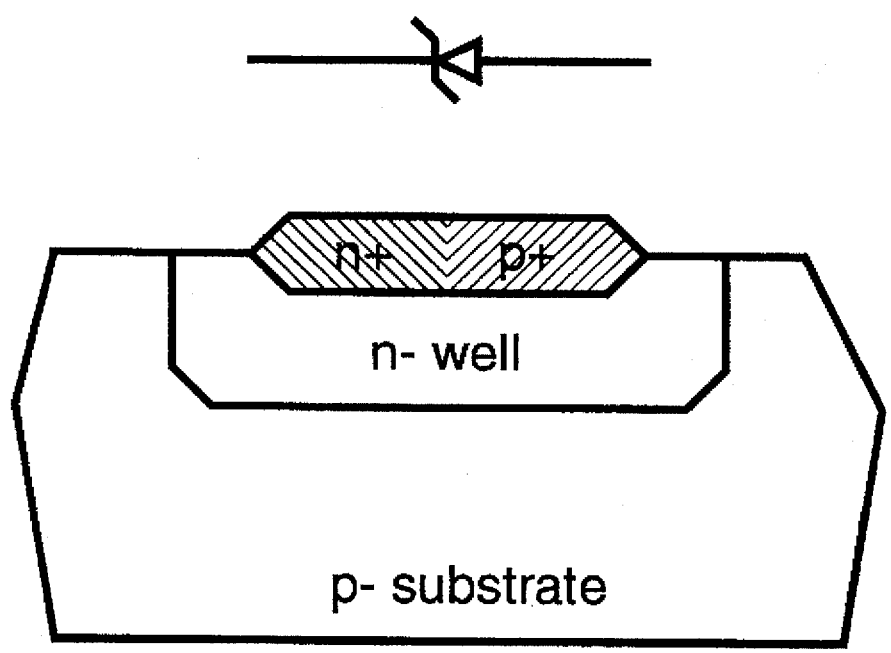

Each current mirror stage drops some of the high voltage output across it. Parasitic zener diodes (16) may be used to provide protection against excessive drain-source voltage that can cause device failure. Referring to FIG. 5, the parasitic zener diode for a n-well process can be constructed by placing a n+ implant in contact with a p+ implant in a n-well. Since these parasitic zener diodes have a zener breakdown of about 3 to 5 volts, a parasitic zener diode connected between the upper rail terminal and the output current terminal of each current mirror will limit the maximum source-drain voltage drop of each of the current mirror stages in the cascade.

The zener diodes (16) shown in FIG. 3 are not essential to practice the invention, however. Those skilled in the art will recognize that the reverse biased drain-to-well diode of each transistor in the current mirror has its own parasitic zener breakdown voltage (typically about 5 to 10 volts) that can provide moderate over-voltage protection without the use of an additional parasitic zener diode, such as one shown in FIG. 5. Also, those skilled in the art will recognize that a voltage limiting effect can result from breakdown, punch through, tunneling and other effects, as described by Chen and Sze. The advantage of not including the parasitic zener diode of FIG. 5 in high voltage circuits of the present invention is that the number of current mirror stages can be reduced for a given output voltage range. Thus, as used herein, the term 'zener diode' refers either to parasitic zener diodes such as the ode shown in FIG. 5 or to the intrinsic drain-to-well zener diode of the current mirror FETs.

The zener diodes limit the total voltage that can be dropped across each of the cascaded current mirrors. By cascading two or more current mirror stages, the full voltage range from ground to $V_{DDhigh}$ can be covered. The number of cascaded current mirror stages needed for a particular application is determined simply by dividing $V_{DDhigh}$ (i.e. the high voltage power source voltage) by the breakdown voltage of the zener diodes for the particular fabrication process. A typical number of current mirror stages in a cascade is 3 or 4, although those skilled in the art will recognize that more or less may be appropriate in different circumstances. Additionally, the number and type of pull-up and pull-down current mirrors need not be the same and may be customized for a particular application. As used herein, the pull-up current mirrors are connected between $V_{DDhigh}$ and $V_{out}$ and the pull-down current mirrors are connected between $V_{out}$ and electrical ground. Those skilled in the art will also recognize that the output circuits of the present invention are not restricted to n-well fabrication processes, as all of the voltages can be reversed and all n and p sections swapped for a p-well fabrication process.

Referring again to FIG. 3, the current input terminals of the current mirrors are connected to a set of high voltage current sources that source (i.e. generate) the control currents for the pull-up cascade of current mirrors. The common control signal on line (23) sets the current level for the pull-up section of the output circuit. The pull-down section of the output circuit (19) is also comprised of cascaded current mirrors that are similarly biased by a second set of high voltage current sources. The upper rail terminal of the top current mirror of the pull-down cascade of current mirrors is connected to the output terminal (18) of the amplifier. The output current terminal of the last current mirror in the pull-down cascade is connected to electrical ground. Electrical ground is arbitrarily chosen herein to be the pull-down voltage.

When the pull-down cascade is activated by a low voltage control signal on line (24), the output voltage will be pulled down to electrical ground. Thus, as used herein, electrical ground is chosen to be the second of the two terminals of the high voltage power source. Those skilled in the art will recognize that the pull-down voltage need not be electrical ground, and can be chosen to be other voltages without affecting the function of the circuit. Low voltage control signals on lines (23) and (24) control the current flowing in the pull-up and pull-down current mirror cascades, enabling low voltage signals to control the high voltage output, $V_{out}$ (18).

The particular type of current mirrors used in the cascaded pull-up and pull-down section of the output circuit of FIG. 3 can be chosen according to circuit specifications for each particular application of the present invention. As shown in Allen and Holberg, a number of different current mirror circuits are described that are appropriate for use with the present invention, for example, cascode (p. 233), Wilson (p.235) or other current mirror circuits can be implemented. Some types of current mirrors, especially those with improved voltage range (see e.g., Allen and Holberg, p. 226), require additional input current terminals per current mirror. In those cases, additional high voltage current source circuits may be needed to implement the circuits of the present invention.

The high voltage output section of FIG. 3 has two control voltage lines (23, 24), with line (23) controlling the pull-up cascade and line (24) controlling the pull-down cascade. These two lines (23, 24) carry low voltage pull-up and pull-down signals that control the output signal. Those skilled in the art will recognize that a variety of pre-amplification circuits can be used with the present invention to generate the control signals on lines (23) and (24). For example, to implement a high-low output driver circuit, an inverter can be used to generate the pull-up and pull-down control signals on lines (23) and (24). For a high voltage differential amplifier, analog signals can be generated from a differential pair. Conventional differential pairs can be employed, and some appropriate examples are described in Allen and Holberg, p. 274. Operational amplifiers can be constructed using the present invention as well.

Figure 6:
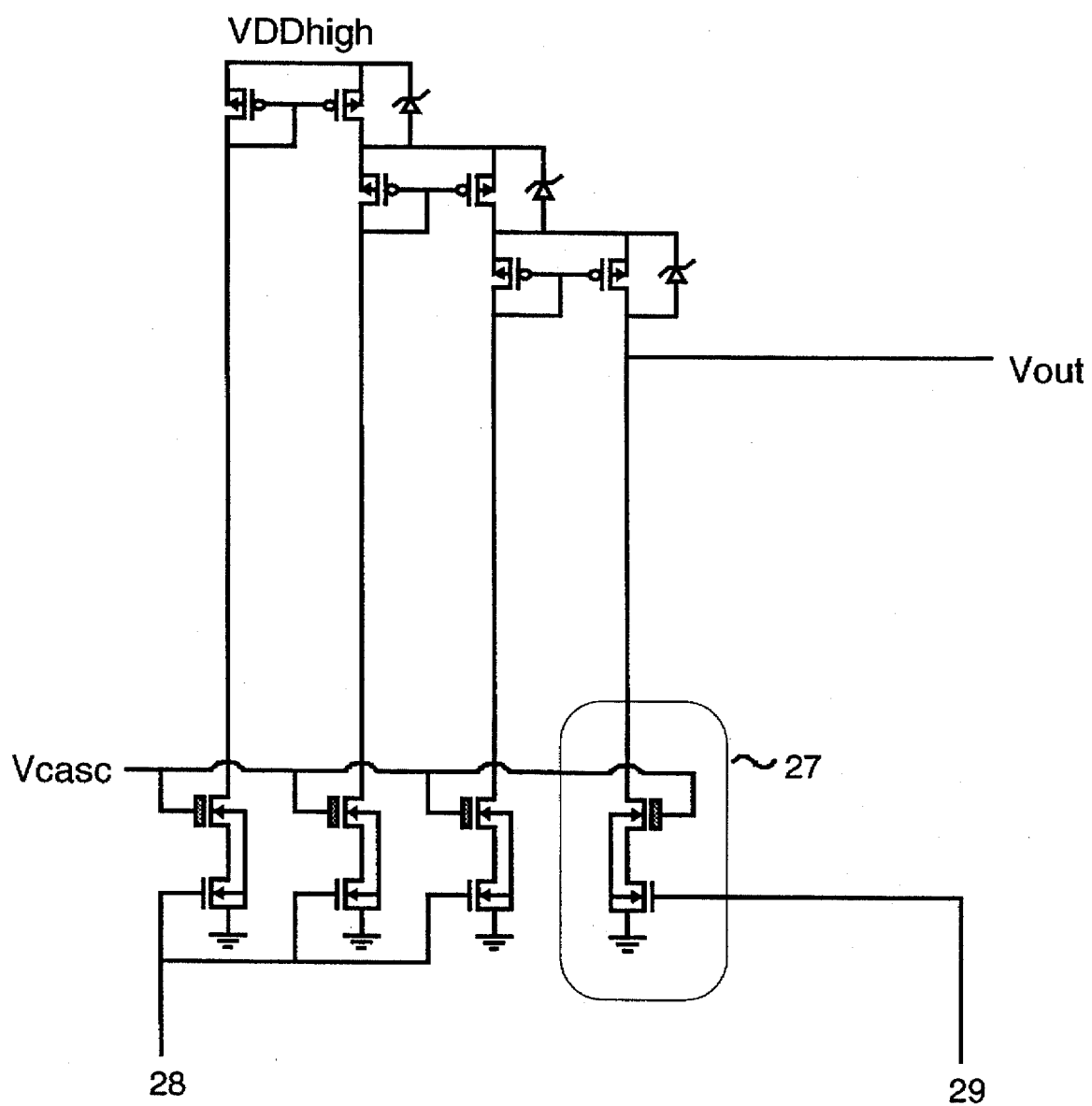
FIG. 6 is a physical cross-section of a parasitic zener diode that can be used as over-voltage protection in the high voltage operation amplifier of FIG. 3.

A variation on the high voltage output circuit of FIG. 3 is shown in FIG. 6. The high voltage output pull-down (27) is a high voltage field oxide FET that acts as a cascode transistor and a series connected low voltage transistor that controls the current level of the pull-down section. In this example, the high voltage field oxide FET must be large enough to have a saturation current greater than the peak pull-down current, as is the case with the high voltage current sources described above. Once again, low voltage control signals on lines (28, 29) are used to control the high voltage output stage.

Figure 7:
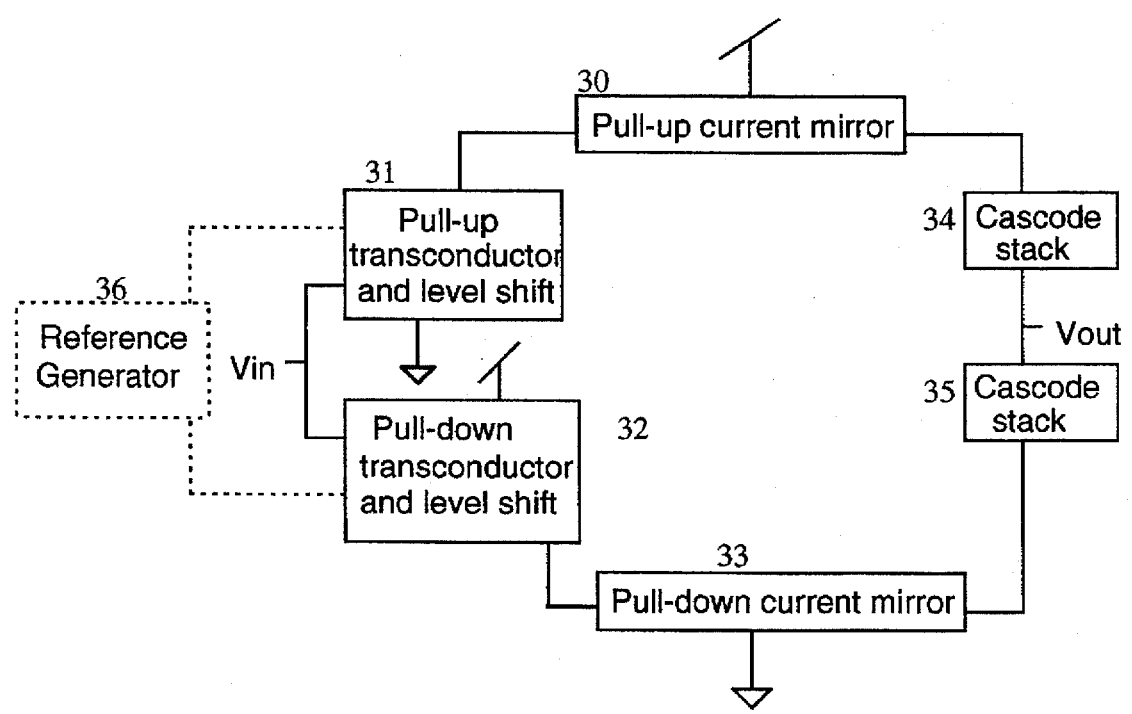
FIG. 7 is a block diagram of a third high voltage output circuit that may be used in the circuit shown in FIG. 1.

Another example of an output stage and current source constructed according to the present invention is shown in FIG. 7. Referring to FIG. 7, the high-voltage output stage is comprised of a pull-up transconductor and level shift circuit (31), which circuit is driven by an input voltage. This input voltage can be generated from numerous sources, including a differential pair amplifier with a voltage output. As used herein, a transconductor is a voltage-controlled current source (VCCS). The pull-up transconductor and level shift circuit (31) has a connection to a current collector, which may be, for example, electrical ground or the negative power supply rail. A pull-up current mirror (30) is connected to a high voltage power source, which power source may be 15 volts or more, and the pull-up current mirror (30) is driven by the signals generated by the pull-up transconductance circuit (31). A pull-up cascode stack (34) is comprised of cascode transistors that are being used herein consistently with the discussion above. The cascode stack (34) transfers the output current generated by the pull-up current mirror onto the load, $V_{out}$.

A pull-down transconductor and level shift circuit (32) is also driven by the input voltage, $V_{in}$, and is connected to a power supply. This power supply does not have to be the same power supply that is connected to the pull-up current mirror, and may preferably be a 3 to 5 volt power supply. The pull-down current mirror (33) is driven by the signals generated by the pull-down transconductor and level shift circuit (32) and is connected to a current collector, again preferably electrical ground or the negative power supply rail. A pull-down cascode stack (35) transfers the output current generated by the pull-down current mirror (33) to the load, $V_{out}$.

Although not necessary to practice the present invention, a reference generator (36) may be included that generates voltages to bias the level shift circuits (31, 32), wherein these bias voltages are responsive to the input voltage, $V_{in}$. Adding such a reference generating circuit (36) can improve the overall accuracy of the output stage of FIG. 7 by reducing errors that are a result of either temperature changes or the particular fabrication process used to implement the present invention.

The operation of the high voltage output stage of FIG. 7 can be understood as follows:

When the input voltage, $V_{in}$, is at its resting potential, both transconductance circuits (31, 32) are either turned off entirely or draw equal and small currents, as determined by the reference signal(s). The whole output stage may draw no or very little current from the high-voltage power supply rails. In this state of operation, no net current is delivered to the load, $V_{out}$. As used herein, the resting potential is the mid-point potential between the low-voltage power source and the current collector.

If the input voltage, $V_{in}$, is more positive than its resting potential, the pull-down transconductance circuit (32) begins to source current, and the pull-down current mirror (33) and the pull-down cascode (35) sink current from the load, $V_{out}$, into the negative power supply rail. If on the other hand, the input voltage, $V_{in}$, is more negative than its resting potential, the pull-up transconductance circuit (31) begins to sink current, and the pull-up current mirror (30) and the pull-up cascode stack (34) source current from the positive high voltage power supply into the load. Even in precision analog applications, the current flowing in the load, $V_{out}$, during large input voltage excursions can easily be 1000 times larger than the quiescent current flowing through the output stage when no current is delivered to the load. Thus, this output stage also is well suited for use in battery-powered portable electronic appliances, in which low power consumption is an overriding design concern.

Figure 8:
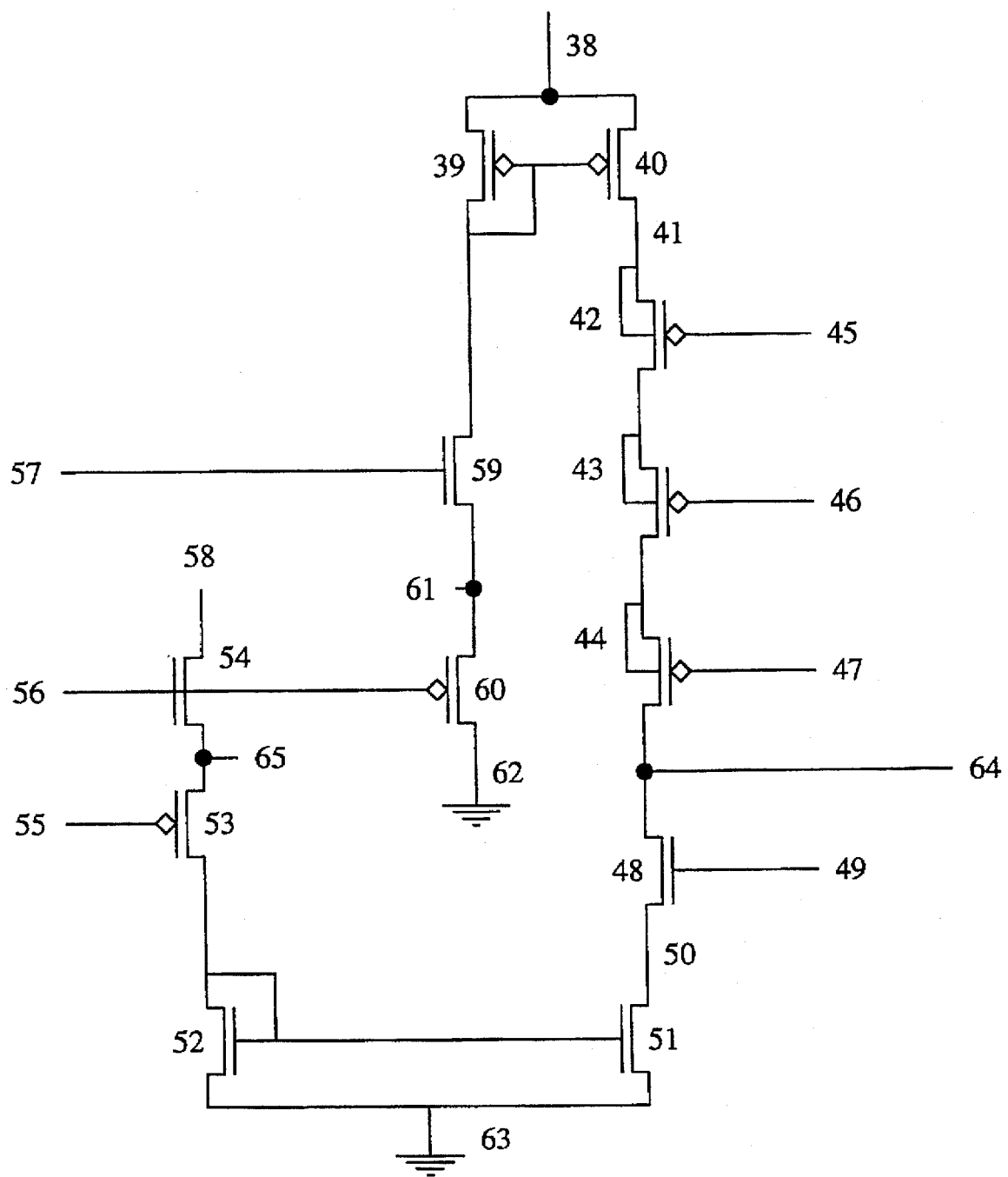
FIG. 8 is a detailed schematic of an example of a circuit that has been constructed according to the block diagram of FIG. 7.

A specific working embodiment of the high-voltage output stage of FIG. 7 is shown in FIG. 8. In that circuit, the pull-up transconductance and level shift circuit is composed of a n-type transistor (59) and a p-type transistor (60). The n-type transistor (59) is used herein as a common-gate cascode, with its drain connected to the pull-up current mirror (39), its gate connected to a first reference voltage at node (57), and its source creating a low-impedance "virtual ground" at node (61). The p-type transistor (60) is used as a common-source transconductor, with its source connected to the virtual ground node (61), its gate connected to the input voltage at node (56), and its drain connected to a current collector, which in this example is the negative power supply rail (62). Since the potential at node (61) is held virtually constant by the low impedance seen at the source of transistor (59), a large fraction—about one half—of any input voltage swing appears as a gate-source voltage change of transistor (60). This input voltage swing therefore leads to relatively large changes in its drain-source current being caused by small changes in input voltage. These current changes, in turn, will be transferred by transistor (59) to the pull-up current mirror (39, 40), which current mirror may operate at a much higher power supply voltage (i.e. greater than 5 volts) than the power supply for the other circuitry on the IC (i.e. typically 3 to 5 volts). Most of the potential difference between the power supply voltage of the pull-up mirror (39, 40), applied at node (38), and the input voltage at node (56) drops across the drain-source channel of cascode transistor (59). Therefore, transistor (59) may need to be a special high-voltage device, and can be constructed according to the field-oxide or LDD transistors described above.

The pull-up mirror (39, 40) can be a simple two-transistor current mirror composed of a p-type input transistor (39) which has its drain and gate terminals connected together and its source terminal connected to a positive power supply (38), and a second p-type output transistor (40) which has its gate connected to the gate and drain of the input transistor (39), its source connected to the positive power supply (38) and its drain delivering current into the cascode stack (41). As is well known to those skilled in the art, the mirror ratio, i.e. the ratio of the drain current of the mirror output transistor (40) to the drain current of the mirror input transistor (39), can be set by the designer, since the mirror ratio is determined by the geometries of the two transistors. In a preferred embodiment of this invention, the mirror ratio is set precisely to be a large integer, such as 10:1, by composing the mirror output transistor (40) of a parallel connection of ten individual, identical copies of the input transistor (39).

The pull-up cascode stack consists of p-type transistors (42, 43 and 44), each of which is constructed within a separate n-type well. As used herein, stack is intended to mean a series-connected chain of like circuit elements, which in this case are cascode transistors. Each of the wells is connected to the respective source terminals. The source and drain terminals of the three cascode transistors (42, 43, and 44) are connected in series, such that current from the pull-up mirror (40) enters the cascode stack at the source of transistor (42), flows through transistors (42, 43, and 44) in that order, and leaves the cascode stack at the drain of transistor (44). The drain of cascode transistor (44) is connected to the output node (64) of the output stage. The gates of all three cascode transistors are connected to individual bias voltages: transistor (42) is connected to node (45), transistor (43) is connected to node (46), and transistor (44) is connected to node (47). The potentials at these bias voltage nodes are chosen such that none of the cascode transistors (42, 43, 44) receives more drain-source voltage stress than is permissible for the chosen IC fabrication process.

In a preferred embodiment of this invention, with a voltage difference of 15 volts between the power supply rails (38 and 63), the bias voltages at nodes (45, 46, and 47) are 10 volts, 6.5 volts and 3 volts, respectively, thereby ensuring each of the cascode transistors (42, 43, and 44) is not stressed with more than a 5 volt potential difference between its drain and source terminals. It will be obvious to those skilled in the art that the number of series-connected transistors in the cascode stack (41) can be more or less than 3, depending upon the maximum voltage difference that the cascode stack has to withstand and the maximum drain-source voltage that a p-type transistor can withstand in the chosen IC fabrication process without suffering permanent damage due to hot-electron injection.

The pull-down transconductance and level shift circuit is composed of a p-type transistor (53) and a n-type transistor (54). This circuit functions in an analogous but complementary way to the pull-up transconductance and level shift circuit (59, 60) described above. In this case, the cascode device is a p-type transistor (53), instead of a n-type transistor (59), and the common-source transconductor is a n-type transistor (54), instead of a p-type transistor (60). Cascode transistor (53) has its drain terminal connected to the input of the pull-down current mirror (52), its gate connected to a reference voltage at node (55) and its source connected to a second virtual ground node (65). The transconductor (54) has its gate terminal connected to the input node (56), its drain connected to a positive power supply at node (58) and its source connected to the second virtual ground at node (55). As was the case with the pull-up transconductor, small changes in input voltage lead to relatively large changes in output current, but here the output current of the transconductance circuit is sourced from the drain of cascode transistor (53) into a n-type current mirror (52).

The pull-down current mirror can be another simple two-transistor mirror. In this example, the pull-down current mirror is composed of a n-type input transistor (52) with its drain and gate terminals connected together and its source connected to a negative power supply at node (63), and a n-type output transistor (51) having its source connected to the negative power supply at node (63) and its drain forming the output node of the mirror at which it sinks an amount of current that is proportional to the amount of current flowing from drain to source of the input transistor (52). The proportionality factor or ratio can be set as explained in the description of the pull-up current mirror (39, 40) above, and will in practical implementations of this invention most likely be set to be exactly the same ratio as the current transfer ratio of the pull-up current mirror (39, 40).

The pull-down cascode circuit consists of a single n-type transistor (48), which cascode transistor has its source connected to the output of the pull-down current mirror (51, 52), its gate connected to a bias voltage at node (49) and its drain connected to the output node (64) of the amplifier. This cascode device transfers any current sunk by the pull-down current mirror output device (51) to the load at node (64), with almost all of the voltage difference between the load voltage and the negative power supply at node (63) dropped across its source-drain channel. The designer may construct transistors (59) and (48), which transistors may have to withstand high drain voltages, as either field-oxide transistors or LDD transistors.

Due to the flexibility of the transconductance and level shift circuits at the input of the high-voltage amplifier output stage, the designer has a wide range of choices for trading off speed and accuracy of the output stage versus power consumption by adjusting the first and second reference voltages (57) and (58) used in FIG. 8.

At one end of the performance range for the output circuit, the designer may choose to reduce the potential difference between the two reference voltages such that a range of input voltages exist around the input resting potential in which neither the pull-up nor the pull-down transconductance and level shift circuit (53, 54, 59, 60) draw any current. Power consumption is minimized in this case, since at the resting potential the whole output stage draws no power from its power supplies, and current only flows when the input voltage is substantially different from its resting potential. The tradeoff for minimal power consumption is twofold. Accuracy is reduced because, as described above, a range of input voltages exist for which the output stage as a whole does not react. Speed is reduced because the circuit has to "wake up" from the no-current state before sufficient current is flowing in the output stage.

At the other end of the performance range, the designer may choose to increase the potential difference between the two reference voltages such that when the input voltage is at its resting potential (between the two reference voltages), substantial current is flowing in both the pull-up and pull-down transconductance and level shift circuits. Accuracy and speed are maximized in this case because all transistors in the output stage are always on and active, ready to respond to the smallest changes in input voltage without any change in the operating regime for the circuit. But increasing the accuracy and speed of the circuit also increases power consumption because relatively large currents are drawn from the power supplies at all times.

In between the two extremes described above the designer may choose to adjust the two reference voltages such that a very small current flows in both the pull-up and pull-down transconductance and level shift circuits when the input voltage is at its resting potential, ensuring a fast and linear response of the circuit to even very small input voltage changes while still drawing very little quiescent power.

Those skilled in the art will notice that the values of the two reference voltages may have to be set very precisely, especially in the case where one desires a very small but finite current to flow through the circuit in its resting state. In other cases, such as when a fairly large no-current dead band is desirable or acceptable, the requirements for the precision of the reference voltage values may be more relaxed.

Figure 9:
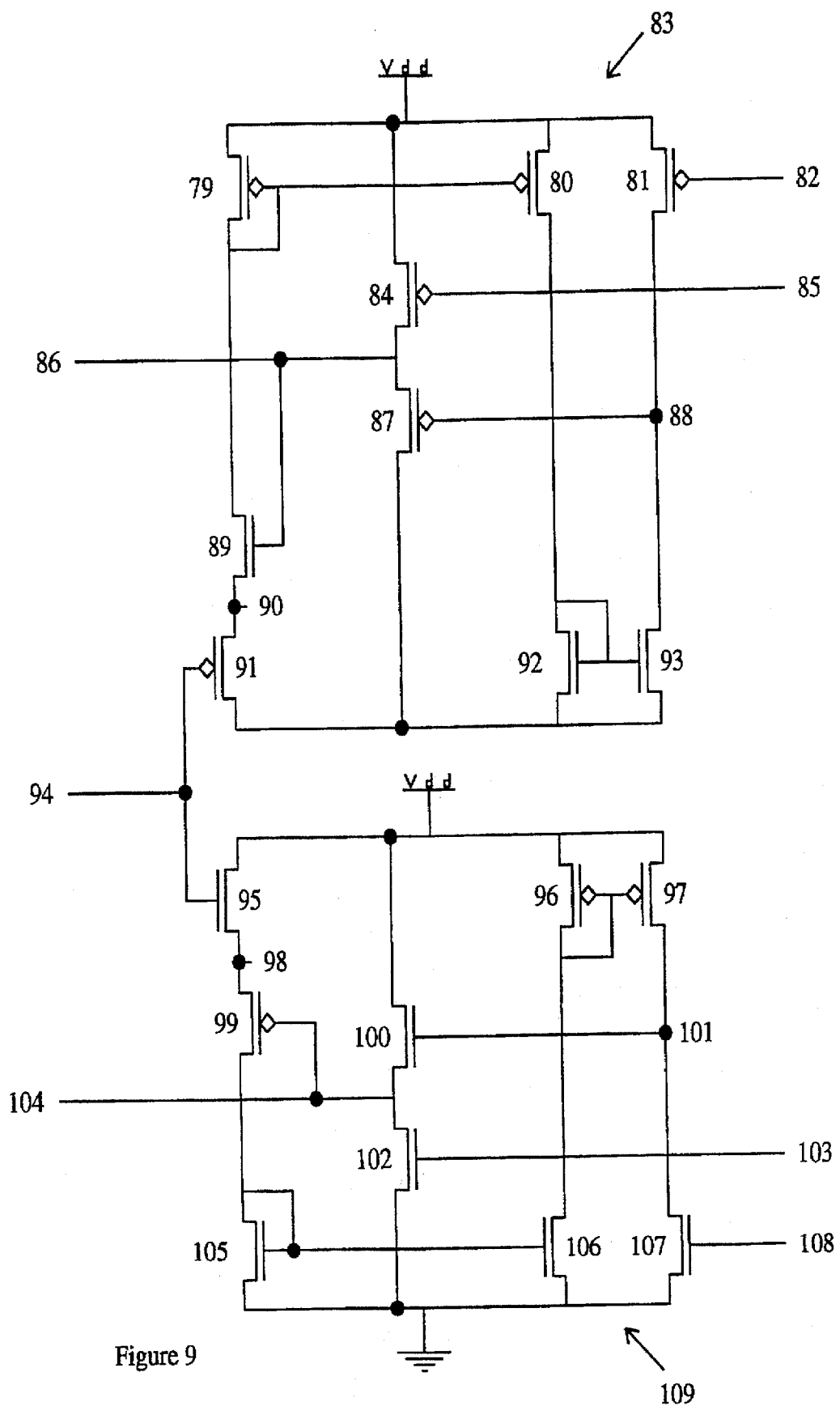
FIG. 9 is an example of a reference generator circuit that can be used to supply reference voltages to the circuits shown in FIGS. 7 and 8.

A preferred embodiment of a circuit that is capable of generating the reference voltages for the pull-up and pull-down transconductance and level shift circuits with a high degree of precision is shown in FIG. 9. This high-precision reference generator comprises copies of the pull-up and pull-down transconductance and level shift circuits, compares the currents that these circuit copies draw with set point currents and uses the comparison results to adjust the two reference voltages to the right voltage level, independent of variations in temperature or manufacturing process. For the sake of brevity, only the top half (83) of the reference generator circuit will be described in detail since the other half (109) of the circuit functions in an analogous way.

Referring still to FIG. 9, transistors (89) and (91) are copies of the pull-up transconductance and level shift circuits (elements (59) and (60) in FIG. 8), and node (90) is a "copy" of the virtual ground node (element (61) in FIG. 8). The resting potential of the input voltage at node (94) is applied to the gate of transconductor transistor (91), and the voltage at node (86) (which is the same voltage as applied to node (57) in FIG. 8) is the reference voltage for the pull-up transconductance and level shift circuit. Here, the reference voltage is applied to the gate of cascode transistor (89). The current through transistors (89) and (90) gets mirrored by means of one p-type current mirror (79, 80), and one n-type current mirror (92, 93).

A bias voltage at node (82), applied to the gate of p-type transistor (81), causes a second current to be sourced into node (88). Node (88) is a high-impedance node in which small differences between the currents flowing in transistors (81) and (93) can cause large voltage swings. The voltage at node (88) gets buffered and level shifted by source-following transistor (87) to become the reference voltage at node (86). The source follower transistor (87) is biased by the drain current of p-type transistor (84), which gets set by a second bias voltage at node (85). The circuit functions as a closed control loop such that if the current in the reference transconductor/cascode pair (89) and (91) is higher than the current set in transistor (81) by bias voltage (82), then the current mirror copy, which is flowing in transistor (93) will pull node (88) lower. The reference voltage at node (86) also will be pulled lower, which reduces the gate-source voltage differences of transistors (89, 91), thereby reducing the current to the set value.

As stated above, the bottom half (109) of the high-precision reference generator circuit of FIG. 9, comprising transistors (95–97, 99–106, 102, 105–107), functions in an analogous way, using a copy of and setting the reference voltage for the pull-down transconductance and level shift circuit of FIG. 8. Those skilled in the art will recognize that this reference generator circuit can be modified in many ways, including by adding current mirrors to allow the use of a single bias voltage to set both pull-up and pull-down reference voltages, without changing the basic function of the circuit.

Figure 10:
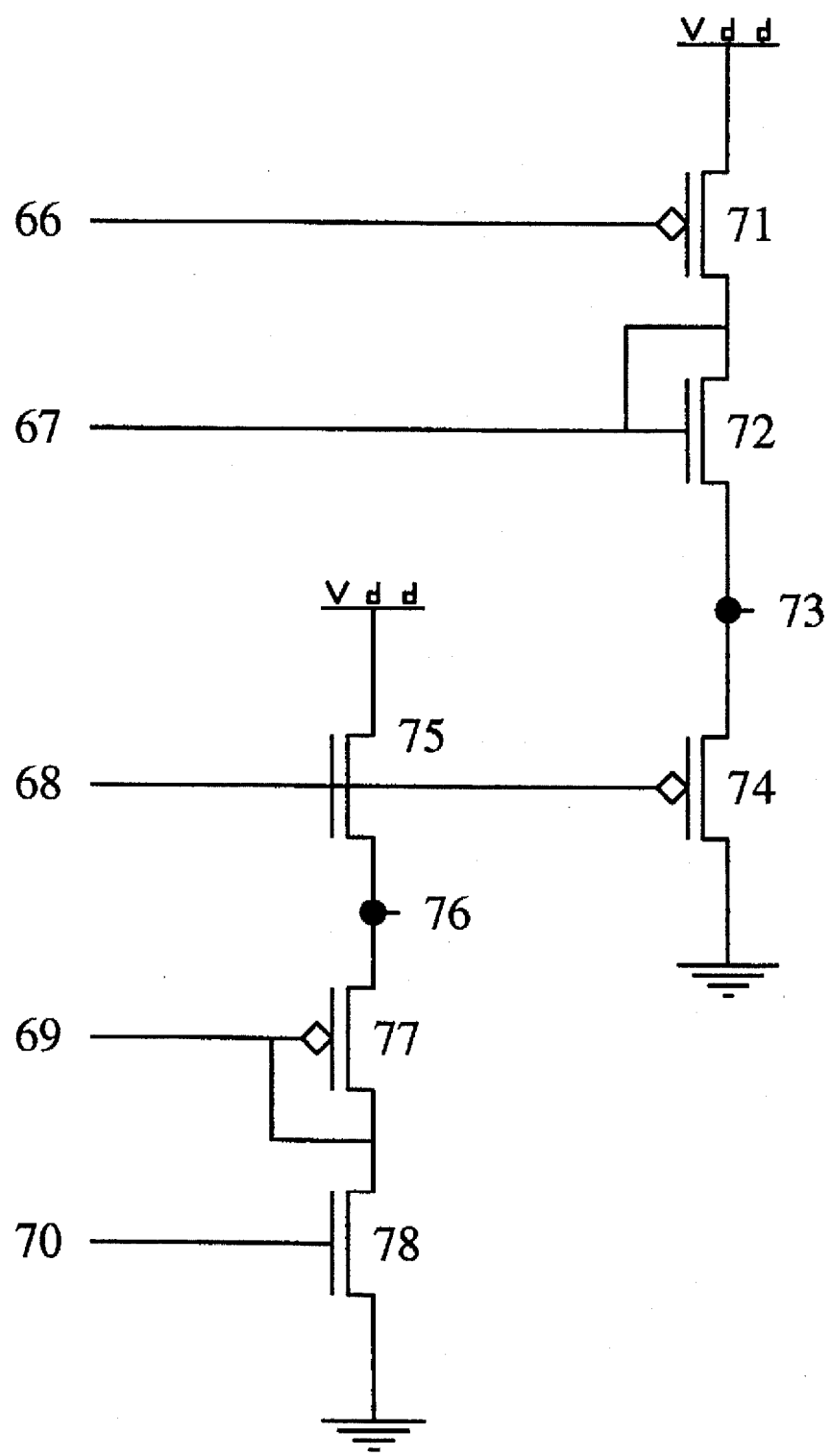
FIG. 10 is a second example of a reference generator circuit that can be used to supply reference voltages to the circuits shown in FIGS. 7 and 8.

For applications with less stringent demands on the precision of the reference voltages, a simplified reference generator can be used. An example of a simplified reference generator is shown in FIG. 10 and again comprises two complementary halves, the top half generating the pull-up reference voltage at node (67) and the bottom half generating the pull-down reference voltage (69). The resting potential of the input voltage at node (68) is applied to the gates of transconductor transistors (74, 75), which are copies of the transconductor transistors (54, 60) from FIG. 8, respectively. The copies (72, 77) of the cascode transistors (elements (59, 53) in FIG. 8, respectively), are connected as diodes, i.e. their gate and source terminals are shorted. Current sources (71, 78), which are controlled by bias voltages at gate nodes (66, 70), respectively, force fixed currents to flow in the two branches of the circuit. Due to the diode connections of transistors (72, 77), the voltages at their gate terminals are in the ideal case just the reference voltages needed to make the same fixed currents flow through the respective transconductor-cascode transistor pairs in the output stage of FIG. 8. This reference generator circuit will show larger current errors than the circuit of FIG. 9, primarily because the copy transistors (72, 77) are operated at different drain-source voltages than their "originals" (59, 53) in the output stage circuit of FIG. 8.

For applications with even fewer demands on the precision of the reference voltages, fixed voltage(s) can be supplied to the transconductance and level shift circuits of FIG. 7. Using fixed voltage(s) might require the least amount of on-chip area and power, but would be expected to incur much larger errors, since no tracking of environmental and manufacturing variations would take place.

Figure 11:
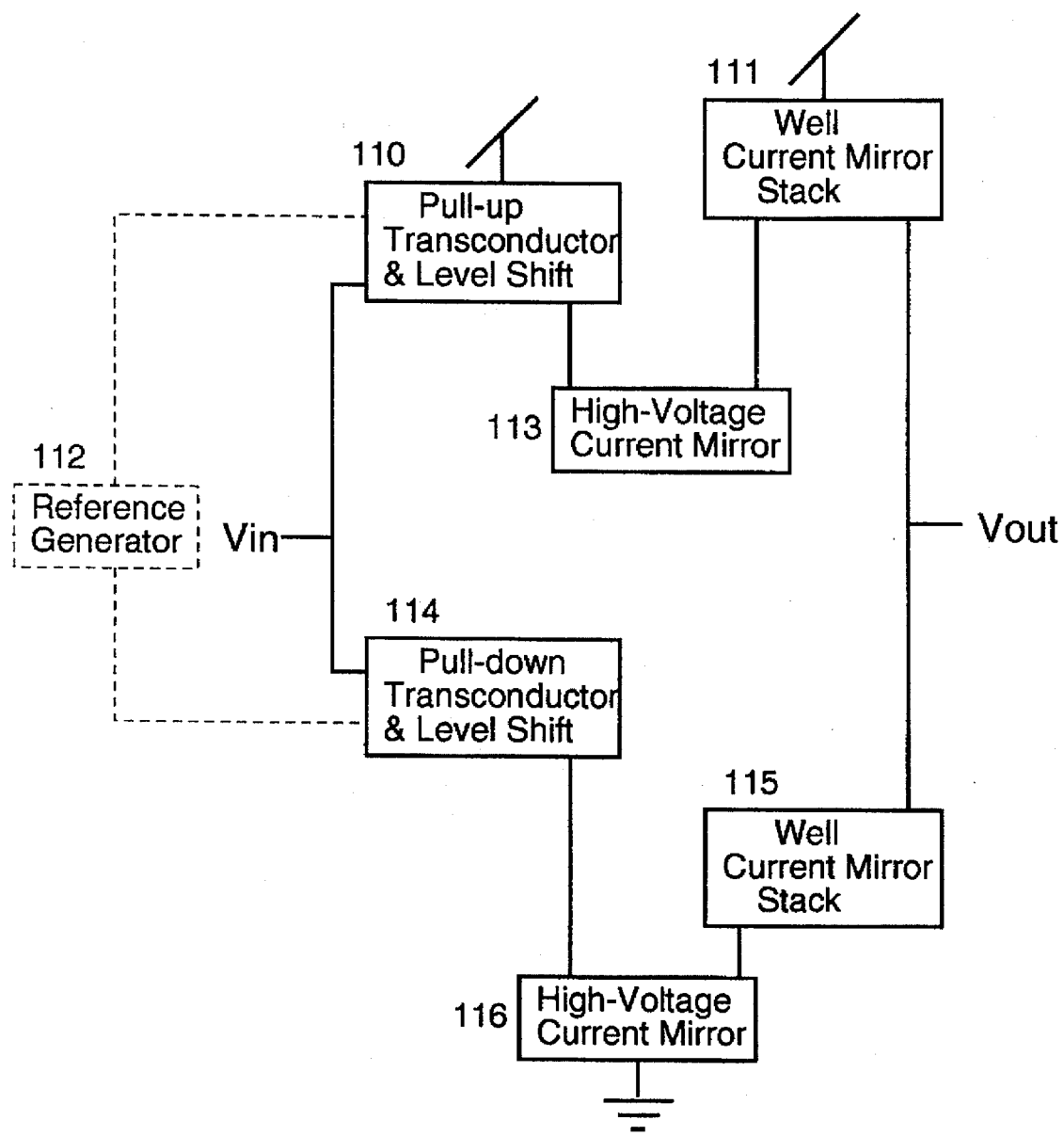
FIG. 11 is a block diagram of a fourth high voltage output stage which is comprised of a cascade of well current mirrors (111, 115) and two transconductance and level shift circuits (110, 114).

A fourth output stage configuration is shown in FIG. 11 in block diagram form. This configuration is in essence a combination of the left-hand (drive) side of FIG. 7 and the right-hand (load) side of FIG. 2. That is, a single input voltage, $V_{in}$, drives two complementary transconductor and level shift stages (110, 114), as described in the discussion of FIG. 8, except that in this example the connections of the pull-up transconductor and level shift stage are reversed with respect to FIG. 7 (i.e., the top output is connected to a positive power supply and the bottom output sources the signal current to the rest of the circuit). This change in connectivity does not affect the operation of the transconductor and level shift stage materially since both outputs are high-impedance drain nodes. The output currents of both transconductor and level shift stages drive the high-voltage current mirrors (113, 116). The output currents of current mirrors (113, 116) in turn pull the load node, $V_{out}$, up and down by means of well current mirror stacks (111, 115), as described in the discussion of FIG. 3. As described earlier, a precision reference generator (112) may be necessary for supplying reference voltages to the transconductor and level shift stages (110, 114).

Figure 12:
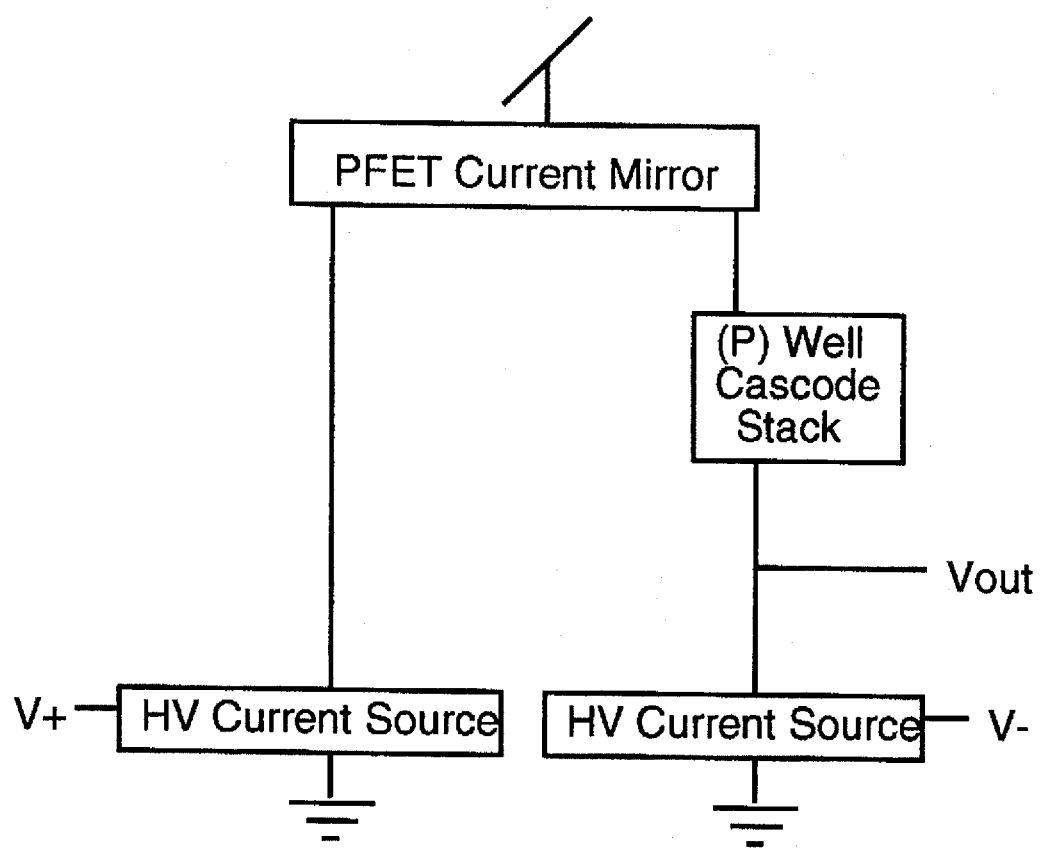
FIG. 12 a block diagram of a fifth high voltage output stage which is comprised of a cascade stack and high voltage current sources.

A fifth output stage configuration is shown in FIG. 12 in block diagram form. This configuration is in essence a combination of the left-hand (drive) side of FIG. 2 and the right-hand (load) side of FIG. 7. That is, the two input voltages (V+ and V−) control the high-voltage current sources, in which one current source supplies the current that ultimately pulls the load voltage at node $V_{out}$ up, and the second current source supplies the current that pulls the load at node $V_{out}$ down. However, the stack of well current mirrors (5) in FIG. 2 is now replaced by a single p-FET current mirror and a stack of well cascodes. The stack of well current mirrors (6) in FIG. 2 is omitted in this example, just as was the case in FIG. 6. The output current of one high-voltage current source drives the p-type current mirror. The output current of the p-type current mirror flows through the cascode stack into the load, pulling it up towards the positive power supply rail. In this way, the p-type current mirror is protected from the large voltage swings seen at the output node, $V_{out}$, in the same way as current mirror (30) was protected by cascode stack (34) in the output stage circuit of FIG. 7. The output of high-voltage current source directly flows from the load and pulls $V_{out}$ down towards the negative power supply rail.

II. Bias-Current Shunting Transistors

Figure 13:
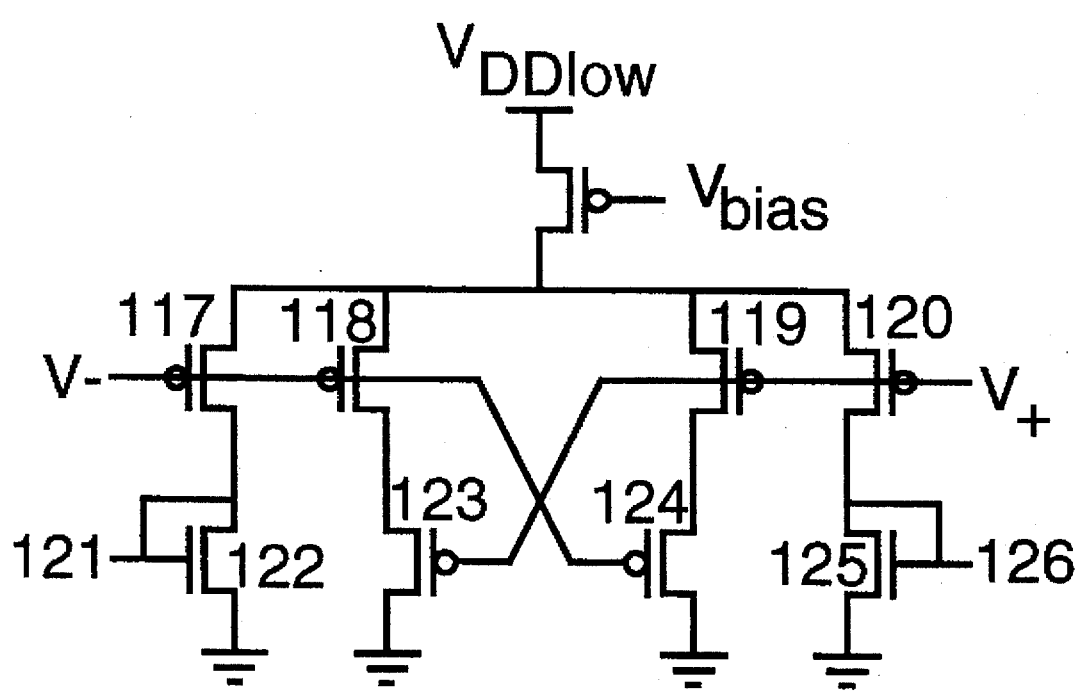
FIG. 13 is a detailed schematic of a differential amplifier having four bias-current shunting transistors (118, 119, 123, 124) that can be used in conjunction with the high voltage output stages of the present invention to form a differential amplifier with high voltage output.

Since many applications require low power operation, a current-limiting pre-amplification circuit, such as a reduced current differential bias circuit, can be used to generate the control voltages on lines (23, 24) shown in the circuit of FIG. 3. To reduce quiescent current draw from the high voltage output power supply, a low power biasing or bias-current shunting circuit can be constructed. An appropriate example is shown in FIG. 13. Preferably, in the present invention, the bias-current shunting circuit of FIG. 13 is used to generate signals for driving a push-pull output circuit.

The bias circuit in FIG. 13 is comprised of a conventional differential pair, i.e. FETs (117, 120), with two additional current shunt paths from the bias p-FET. Current for the differential pair (117, 120) is provided by a bias-current source, which in this example is provided by a p-FET and a low voltage power source, $V_{DDlow}$, which is typically 3 to 5 volts. If the shunt transistors (118, 119, 123, 124) are designed to be much larger than the differential pair transistors (117, 120), when the input voltages on the gates of differential pair FETs (117, 120) (V+ and V−) are the same, the majority of the bias current is shunted through the middle branch shunt FETs (118, 119, 123, 124). In this example, the shunted bias-current is collected by a current collector, which is the electrical ground terminal in the example of FIG. 13. Those skilled in the art will recognize that other current collecting voltages may be used to practice the present invention.

Two FETs (122, 125) are used to collect the current through the outside branch FETs. These FETs (122, 125) convert the current flowing through the outer branch (i.e. differential pair) FETs (117, 120) into pull-up and pull-down signals. An input voltage difference causes current flow through the added n-channel FETs (122, 125). The current flow arising from an input voltage difference drives the output pull-up and pull-down circuits through lines (121, 126).

As an example, this quiescent current limiting circuit can be added to the high voltage amplifier of FIG. 3 by connecting lines (121, 126) of FIG. 13 to lines (23, 24) of FIG. 3. Thus, the pull-up and pull-down signals generated by the circuit in FIG. 13 can act as the control signals for the current sources of FIG. 3.

Figure 15:
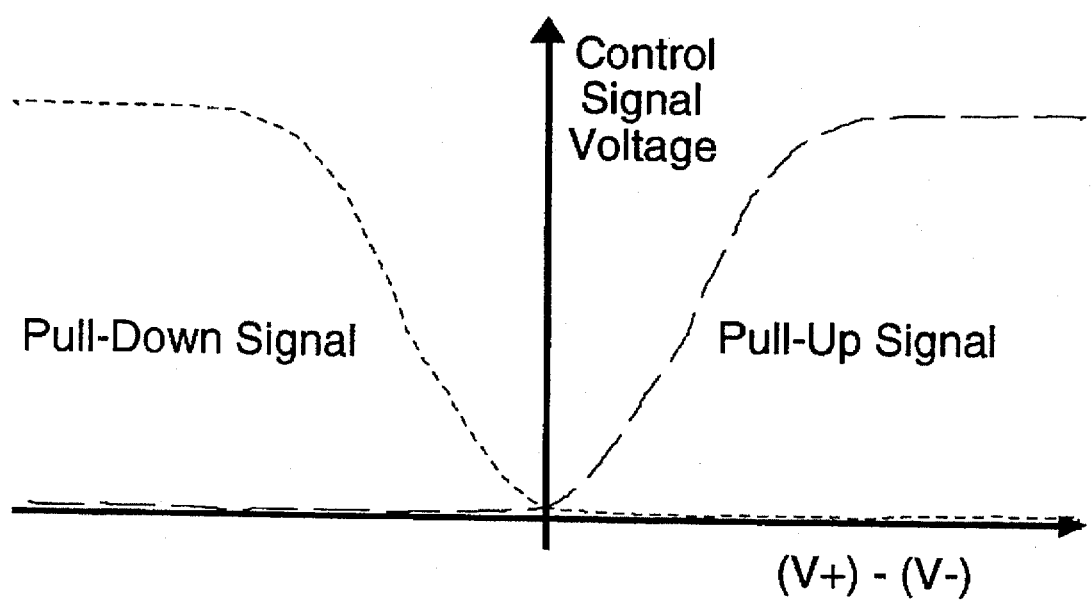
FIG. 15 is a graph of the pull-up and pull-down control signal voltages generated by the circuits of FIGS. 13 and 14 in response to a varying differential input. The pull-up and pull-down signals both drop to low levels when the differential input voltage is near zero.

The degree of current shunting that occurs when equal voltages are applied to the two input terminals of the differential pair is determined by the ratio of transistor sizes of the middle branches to the transistor sizes of the outer branches. Referring to FIG. 15, a graph of typical control voltages on lines (121, 126) is shown as a function of the input voltage difference (V+ minus V−).

Those skilled in the art will recognize that the shunted bias-current transistors described herein and shown in FIG. 13 can be useful to limit quiescent current draw in any amplifier that requires current gain in a second output stage. The output stage does not have to be capable of supplying high voltages. These shunted bias-current amplifiers are especially useful for the efficient driving of large capacitive loads.

Those skilled in the art also will recognize that numerous different pre-amplifier and differential amplifier configurations can be used to generate the control signals for the current source(s) (2) and output stage (1) of FIG. 1. Micropower amplifier design techniques, such as those described in M. G. Degrauwe, J. Rijmenants, E. A. Vittoz and H. J De Man, 'Adaptive Biasing CMOS Amplifiers,' *IEEE Journal of Solid State Circuits*, Vol. SC-17, No. 3, pp. 522–528, 1982, can be used to generate the control signals and further limit the power consumption of circuits constructed according to the present invention. Those skilled in the art will also recognize that the arrangement of the inner branch FETs (118, 119, 123, 124) can be modified while preserving the current shunting function. For example, FETs (119, 124) can be removed from the circuit shown in FIG. 13 and the current shunting function of the inner branch FETs is maintained. An example of a pre-amplifier having two bias-shunting current transistors is shown in example 14.

Figure 14:
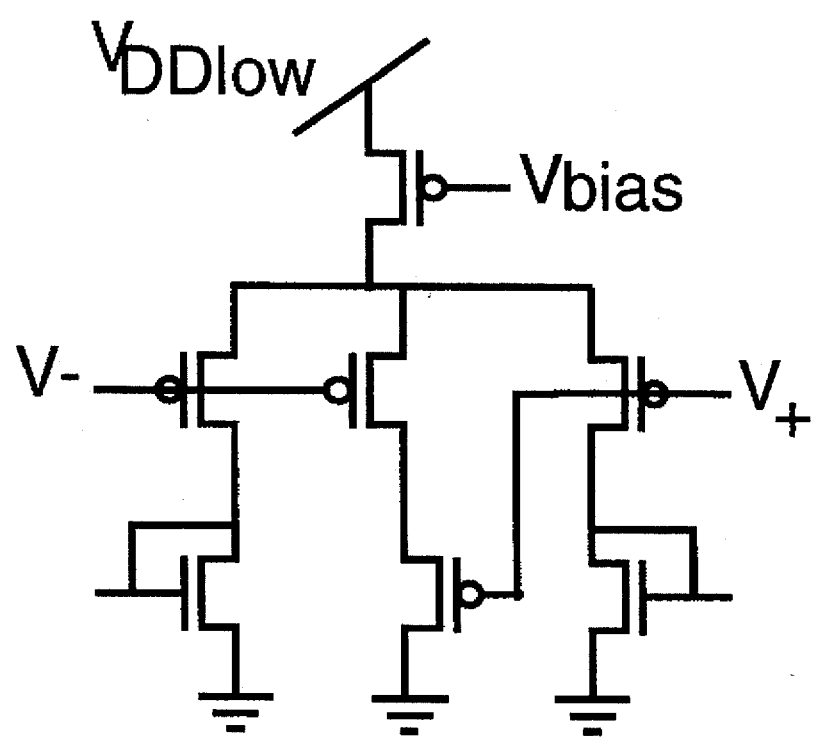
FIG. 14 is a detailed schematic of a second differential amplifier having two bias-current shunting transistors that can be used in conjunction with the output stages of the present invention to form a differential amplifier with high voltage output.

The circuits shown in FIGS. 13 and 14 have advantages over conventional micropower amplifiers, such as those amplifiers shown in Allen and Holberg, p. 502, and in Degrauwe et al. in that these circuits do not have instability problems and do not require well matched components. Those skilled in the art will realize that the control signal generating circuit described above can be used in any low power amplifier by driving an output stage with the control signals (121, 126). Also, those skilled in the art will recognize that the conversion of the currents flowing through FETs (117, 120) into pull-up and pull-down or control signals can be accomplished by a number of different circuits, such as resistors, current sources or an additional diode connected to FETs (117, 120).

Figure 16:
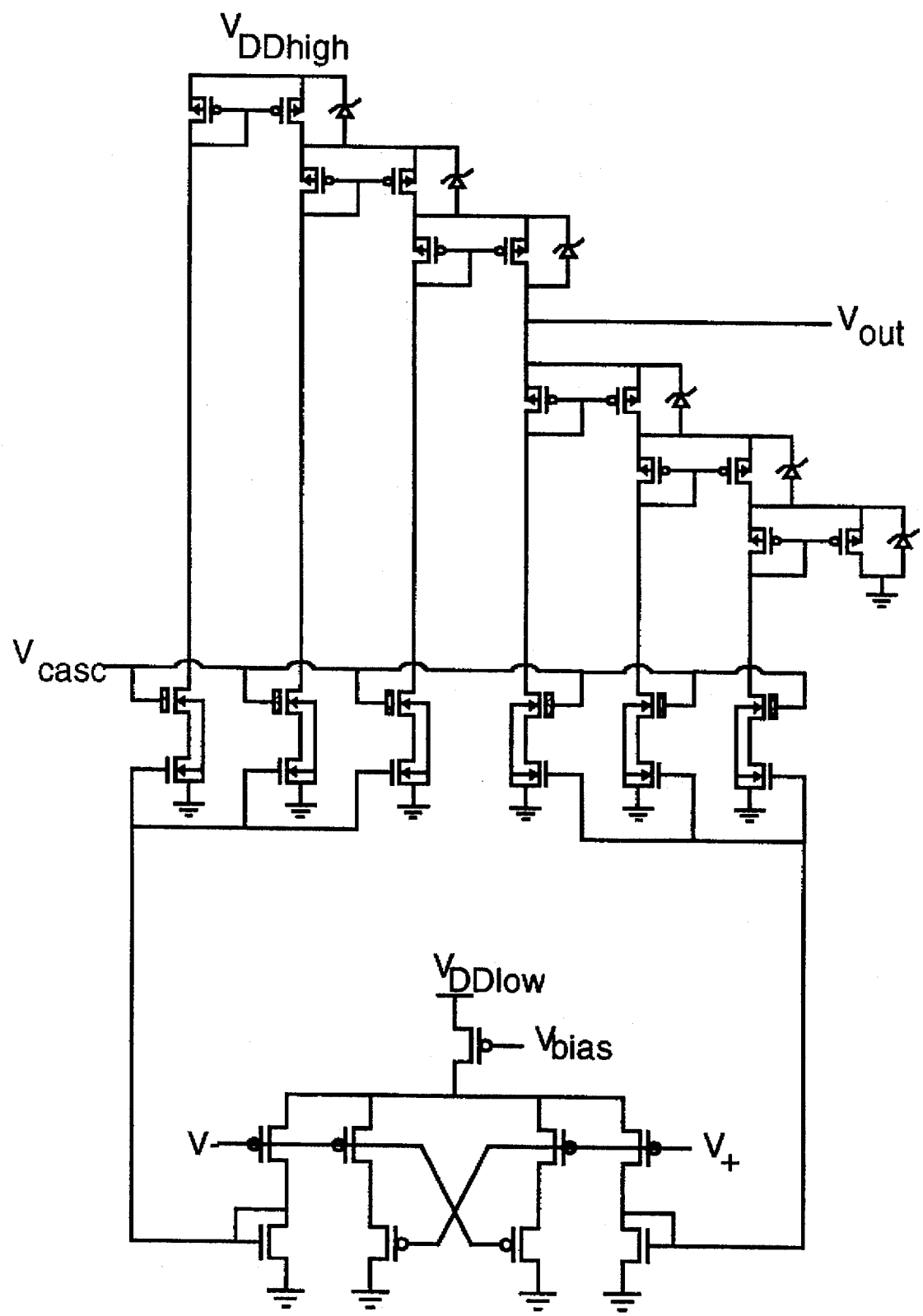
FIG. 16 is a detailed schematic of a combination of the circuits of FIGS. 3 and 13 and depicts one example of a complete high voltage amplifier system that is capable of amplifying the difference between two signals, while limiting current draw from the high voltage power source.

Combining the circuits of FIG. 3 and FIG. 13 results in a differential amplifier with high voltage output and low quiescent power draw (i.e. consumption) from the high voltage power supply and is shown in FIG. 16. When the differential input voltages (V+) and (V−) are equal, the quiescent output current is limited approximately to the peak output current divided by the ratio of the inner branch FET size to the outer branch FET size. In this sense, the term 'limited' refers to any reduction in quiescent current draw from the peak output current level. The quiescent current can, in practice, be limited to a range anywhere from nearly the peak output current to well below one hundredth of the peak output current. Those skilled in the art will recognize numerous modifications that can achieve the same goal of limiting quiescent current using the circuit techniques described herein.

If a differential pair amplifier having a voltage output is used to supply input signals to an output stage having transconductor and level shift circuits, e.g. the circuits described in FIG. 7, bias-current shunting transistors may be used to reduce the quiescent current consumption of the differential pair amplifier. The transconductors of the output stage will serve to further reduce quiescent power consumption from the high voltage power supply in the output stage.

III. Liquid Crystal Display Driver Circuits

The circuits described herein are ideal for driving large capacitive loads like those found in LCD driver applications to display video image information. Typical passive or active LCD applications have a large array of pixels that are addressed by a grid of row and column electrodes. These driving electrodes activate the liquid crystal material to produce variable light output in response to the video image information. For typical screen resolutions, over a thousand row and column electrodes must be driven to create a video image on the display. The present invention allows the low cost integration of power efficient amplifiers that can reliably drive the high voltages onto the row and column electrodes.

Figure 17:
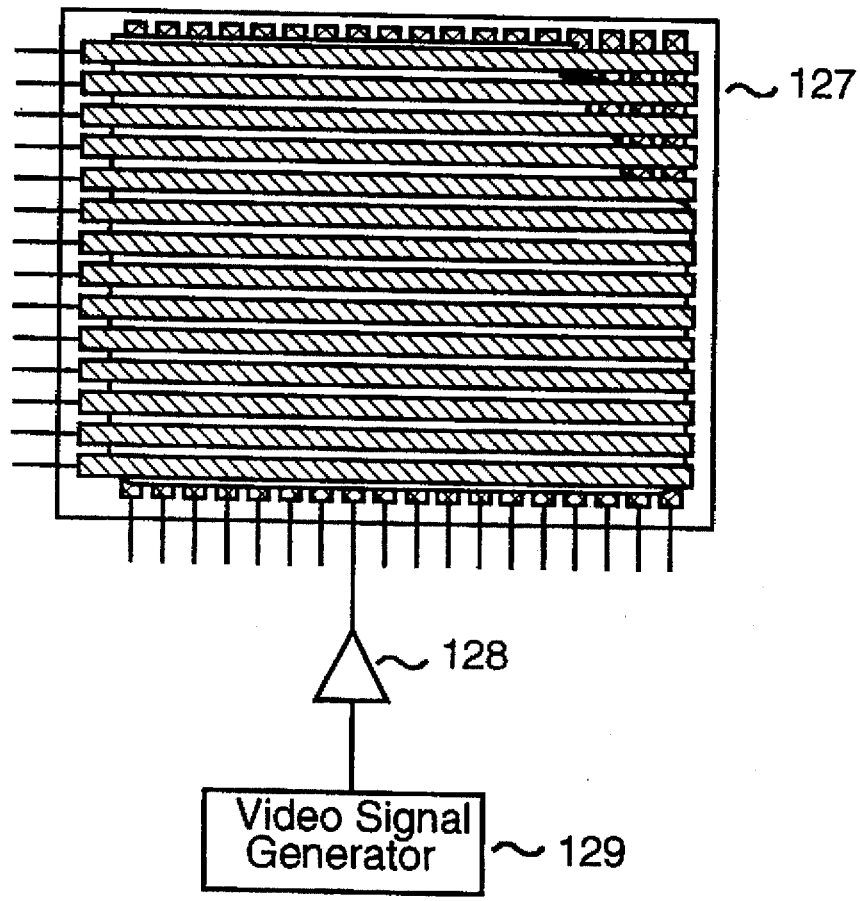
FIG. 17 is a block diagram of a liquid crystal display system incorporating a high voltage amplifier (128) constructed according to the present invention.

An example of the use of the present invention in a liquid crystal display system is shown in FIG. 17. FIG. 17 is a schematic that shows a LCD panel (127) and the circuitry associated with driving one column of the display. A voltage representative of the video pixel information can be generated from the direct video information or by using conventional video image processing circuitry (129). In applicants' preferred embodiment, a linear transform of the video pixel information is generated and driven onto the LCD electrodes using high voltage amplifier circuits (128) constructed according to the present invention. Examples using the present invention in an LCD system are described in the copending U.S. patent application, Ser. No. 08/186,372.

IV. Switched Capacitor Amplifiers

Figure 18:
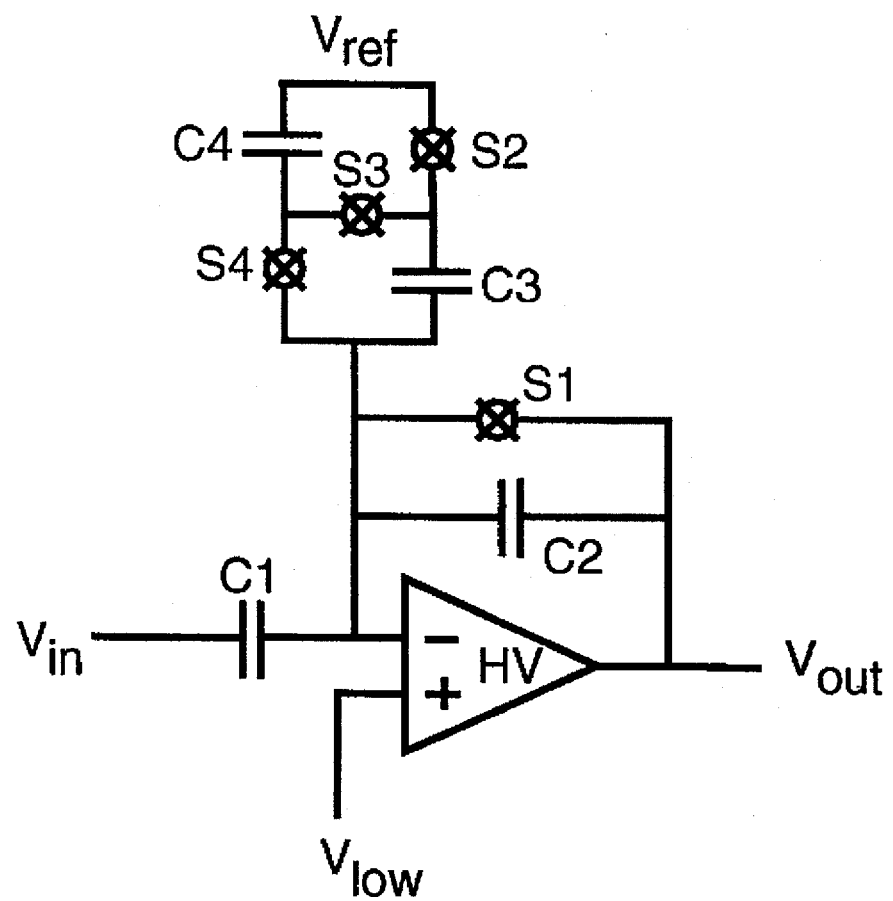
FIG. 18 is a high voltage switched capacitor inverting amplifier, employing a high voltage operational amplifier of the present invention and a high voltage switch, S1.

A switched capacitor amplifier utilizing the present invention is shown as an example of the application of the high voltage amplifiers described herein. The configuration shown in FIG. 18 is an offset compensated switched capacitor inverting amplifier. Examples of these types of circuits generally can be found in R. Gregorian and G. C. Temes, *Analog MOS Integrated Circuits for Signal Processing*, John Wiley & Sons, New York, 1986.

In one preferred embodiment, capacitors C3 and C4 are twice the size of C2 and act to eliminate the offset of the amplifier. During the reset phase of the switched capacitor clocking, S1, S2 and S4 are closed, while S3 is open. During the amplify phase of the switched capacitor clocking, switches S1, S2 and S4 are opened and S3 is closed. Capacitors C3 and C4 inject the desired amount of charge onto the negative terminal of the amplifier to remove the offset voltage effect from the output.

Note that switch S1 has one terminal that may exceed the voltage limits of normal thin-oxide FETs. Therefore, a switch that can sustain high (greater than 10 volts) voltages may be required to implement this circuit. A LDD transistor may be used to sustain the high voltage or, as shown in the example below, a field-oxide transistor may be used to sustain the high voltage.

V. High Voltage Switch

Figure 19:
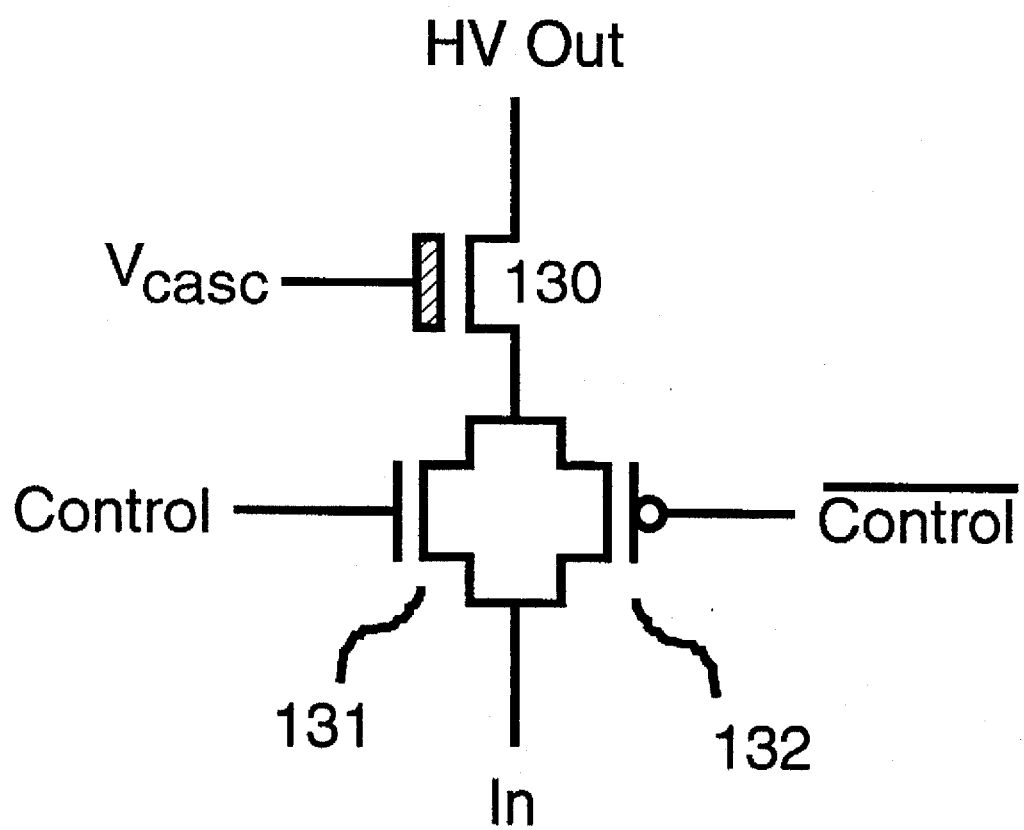
FIG. 19 is high voltage switch constructed from a high voltage field oxide FET (130) and two conventional low voltage FETs (131, 132). This special switch can be used as the reset switch S1 of the high voltage amplifier of FIG. 18.

Referring to FIG. 19, a high voltage switch is shown that is appropriate, but not necessary, for use with the circuit in FIG. 18. The switch action is performed by a conventional p-FET (132) and n-FET (131) switch pair. A high voltage field-oxide or cascode FET (130), as described in FIG. 4 above, acts to buffer one terminal of the switch, so that the switch can be connected to high voltages. The high voltage cascode transistor (130) in this example cannot conduct unless its source voltage is at a low voltage, typically around 1 volt. For this reason, when using this high voltage switch with the switched-capacitor amplifier of FIG. 18, the positive input to the high voltage amplifier is set at this low voltage, $V_{low}$. When the amplifier is being reset by closure of switch S1, the inverting input of the amplifier will be driven to approximately $V_{low}$. Thus $V_{low}$ should be set low enough to permit conduction in the high voltage cascode transistor. Note that the differential pair of the high voltage amplifier, shown in FIG. 16, is comprised of p-FETs that can function properly at low input voltages. Those skilled in the art will recognize that conventional high voltage switches also can be used to practice the present invention.

The described examples and figures are intended to be illustrations of the present invention and should not be interpreted as limitations. The headings have been included for the purpose of organization only and should not be interpreted to limit the claims or the disclosure. Those individuals with ordinary skill in the art will recognize that numerous changes can be made to the described embodiment without departing from the spirit of the present invention.

For example, those skilled in the art will also recognize that the circuit examples described in this application can also be implemented using bipolar technology, instead of CMOS technology as described above. Therefore, n-type FETs are replaced with npn bipolar transistors and p-type FETs are replaced with pnp bipolar transistors, and connecting them as described above, with the terms "drain," "gate," and "source" replaced by the terms "collector," "base," and "emitter" as customary for the terminals of bipolar transistors.

We claim:

1. A high voltage output stage for driving a liquid crystal display, comprising:

(a) a first transconductor and level shift circuit, wherein an input voltage representative of video information is applied to the first transconductor and level shift circuit;

(b) a first current mirror, wherein the first current mirror is connected to the first transconductor and level shift circuit, and is also connected to a first output power supply;

(c) at least a first cascode transistor, wherein the first cascode transistor is connected to the first current mirror;

(d) a second current mirror, wherein the second current mirror is connected to the first cascode transistor and to a current collector and wherein an output voltage is generated at a node connecting the first cascade transistor and the second current mirror;

(e) a second transconductor and level shift circuit, wherein the second transconductor and level shift circuit is connected to the second current mirror, and wherein the input voltage is applied to the second transconductor and level shift circuit; and (f) means for applying the output voltage to at least one liquid crystal display electrode.

2. A high voltage output stage for driving a liquid crystal display as in claim 1 further comprising a reference generator, wherein the reference generator supplies reference voltages to the first and second transconductor and level shift circuits.

3. A high voltage output stage as in claim 1 wherein the first transconductor and level shift circuit comprises:

(a) a thin-gate p-type FET having a gate, source and drain, wherein the gate is connected to the input voltage; and (b) a cascode n-type FET having a gate, source and drain, wherein the cascode n-type FET is connected to the thin-gate p-type FET and the cascode n-type FET is connected to the first current mirror.

4. A high voltage output stage as in claim 1 wherein the second transconductor and level shift circuit comprises:

(a) a thin-gate n-type FET having a gate, source and drain, wherein the gate is connected to the input voltage; and (b) a cascode p-type FET having a gate, source and drain, wherein the cascode p-type FET is connected to the thin-gate n-type FET and the cascode p-type FET is connected to the second current mirror.

5. A high voltage output stage as in claim 1 further comprising a second cascode transistor, the first and second cascode transistors each having a gate, source and drain, wherein the source of the first cascode transistor is connected to the first current mirror, the drain of the first cascode transistor is connected to the source of the second cascode transistor and the drain of the second cascode transistor is connected to the second current mirror.

6. A high voltage output stage as in claim 5 wherein the first cascode transistor is a p-type transistor and the second cascode transistor is an n-type transistor.

7. A high voltage output stage as in claim 6 wherein the first cascode transistor is biased by a first reference voltage and the second cascode transistor is biased by a second reference voltage and wherein the output voltage is generated at a node that connects the first cascode transistor and the second cascode transistor.

8. A high voltage output stage as in claim 1 further comprising a second, third and fourth cascode transistor, each cascode transistor having a gate, drain and source, wherein the first, second, third and fourth cascode transistors are series connected between the first and second current mirrors.

9. A high voltage output stage as in claim 8 wherein the first, second and third cascode transistors are p-type and the fourth cascode transistor is n-type.

10. A high voltage output stage as in claim 9 wherein the first, second and third cascode transistors are biased with three different reference voltages.

11. A high voltage output stage as in claim 1 wherein the input voltage is generated by a differential pair amplifier.

12. A high voltage output stage as in claim 1 wherein the first output power supply generates a voltage power supply of at least 15 volts.

13. A high voltage output stage as in claim 1 wherein the second transconductor and level shift circuit is connected to a second output power supply.

14. A high voltage output stage as in claim 13 wherein the second output power supply generates a 3 to 5 volt power supply.

15. A high voltage output stage for driving a liquid crystal display, comprising:

(a) a first transconductance and level shift circuit, wherein an input voltage representative of video information is applied to the first transconductance and level shift circuit;

(b) a first high voltage current mirror, wherein the first high voltage current mirror is connected to the first transconductance and level shift circuit;

(c) a first well current mirror stack, wherein the first well current mirror stack is connected to the first high voltage current mirror and to an output power supply;

(d) a second well current mirror stack, wherein the second well current mirror stack is connected to the first well current mirror stack, wherein an output node is formed by the connection of the first and second well current mirror stacks and wherein at least one liquid crystal display electrode is connected to the output node;

(e) a second high voltage current mirror, wherein the second high voltage current mirror is connected to the second well current mirror stack and to a current collector; and (f) a second transconductance and level shift circuit, wherein the second transconductance and level shift circuit is connected to the second high voltage current mirror and the input voltage is applied to the second transconductance and level shift circuit.

16. A high voltage output stage as in claim 15 wherein the first well current mirror stack comprises at least two well current mirrors having at least a first current mirror and a last current mirror, wherein each well current mirror has an output terminal, an upper rail terminal and at least one input terminal, wherein the output terminal of each well current mirror, except for the last current mirror in the first well current mirror stack, is connected to the upper rail terminal of the following well current mirror and wherein the output terminal of the last well current mirror is connected to the second well current mirror stack.

17. A high voltage output stage as in claim 16 wherein at least one input terminal of each well current mirror is connected to the first high voltage current mirror.

18. A high voltage output stage as in claim 17 wherein the upper rail of the first well current mirror is connected to the output power supply.

19. A high voltage output stage as in claim 16 wherein the second well current mirror stack comprises at least two well current mirrors having at least a first current mirror and a last current mirror, wherein each well current mirror has an output terminal, an upper rail terminal and at least one input terminal, wherein the output terminal of each well current mirror, except for the last current mirror in the second well current mirror stack, is connected to the upper rail terminal of the following well current mirror and wherein the output terminal of the last well current mirror is connected to the second high voltage current mirror.

\* \* \* \* \*